US009519226B2

(12) United States Patent
Chen et al.

(10) Patent No.: US 9,519,226 B2
(45) Date of Patent: Dec. 13, 2016

(54) OPTICAL IMAGING WRITER SYSTEM

(71) Applicant: Applied Materials, Inc., Santa Clara, CA (US)

(72) Inventors: Jang Fung Chen, Cupertino, CA (US); Thomas Laidig, Richmond, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 330 days.

(21) Appl. No.: 14/203,168

(22) Filed: Mar. 10, 2014

(65) Prior Publication Data

US 2014/0192336 A1 Jul. 10, 2014

Related U.S. Application Data

(60) Division of application No. 12/475,114, filed on May 29, 2009, now Pat. No. 8,670,106, which is a
(Continued)

(51) Int. Cl.
*G03B 27/42* (2006.01)
*G03B 27/54* (2006.01)
*G03F 7/20* (2006.01)

(52) U.S. Cl.
CPC ....... *G03F 7/70383* (2013.01); *G03F 7/70275* (2013.01); *G03F 7/70291* (2013.01); *G03F 7/70508* (2013.01); *G03F 7/70791* (2013.01)

(58) Field of Classification Search
CPC .......................... G03F 7/70508; G03F 7/70291
(Continued)

(56) References Cited

U.S. PATENT DOCUMENTS 5,496,669 A * 3/1996 Pforr ................... G03F 7/70675
356/123
5,668,624 A 9/1997 Naraki et al.
(Continued)

FOREIGN PATENT DOCUMENTS

CN 1918517 A 2/2007
CN 101176042 A 5/2008
(Continued)

OTHER PUBLICATIONS

English translation of Chinese Office Action for Application No. 201180042657.9 dated Oct. 10, 2014; 11 total pages.
(Continued)

*Primary Examiner* — Hung Henry Nguyen
(74) *Attorney, Agent, or Firm* — Patterson & Sheridan, LLP

(57) ABSTRACT

System and method for applying mask data patterns to substrate in a lithography manufacturing process are disclosed. In one embodiment, a parallel imaging writer system comprises a plurality of spatial light modulator (SLM) imaging units, and a controller configured to control the plurality of SLM imaging units. Each of the plurality of SLM imaging units includes one or more illumination sources, one or more alignment sources, one or more projection lenses, and a plurality of micro mirrors configured to project light from the one or more illumination sources to the corresponding one or more projection lens. The controller synchronizes movements of the plurality of SLM imaging units with movement of a substrate in writing a mask data to the substrate in a lithography manufacturing process.

3 Claims, 27 Drawing Sheets

Related U.S. Application Data continuation-in-part of application No. 12/337,504, filed on Dec. 17, 2008, now Pat. No. 8,253,923.

(60) Provisional application No. 61/099,495, filed on Sep. 23, 2008, provisional application No. 61/162,286, filed on Mar. 21, 2009.

(58) Field of Classification Search
USPC ............... 355/53, 55, 67; 359/290–292
See application file for complete search history.

(56) References Cited

U.S. PATENT DOCUMENTS

| | | | | |
|---|---|---|---|---|
| 5,680,200 | A * | 10/1997 | Sugaya | G03F 7/70241 250/201.1 |
| 5,878,152 | A | 3/1999 | Sussman | |
| 6,512,573 | B2 * | 1/2003 | Furter | G03F 7/70216 250/492.2 |
| 7,167,296 | B2 | 1/2007 | Meisburger | |
| 7,285,365 | B2 | 10/2007 | Ekberg | |
| 7,295,362 | B2 * | 11/2007 | Meisburger | G03F 7/70216 355/35 |
| 7,302,111 | B2 | 11/2007 | Olsson et al. | |
| 7,800,811 | B2 | 9/2010 | Lous | |
| 8,159,649 | B2 | 4/2012 | Kato | |
| 2003/0209676 | A1 | 11/2003 | Loschner et al. | |
| 2004/0119021 | A1 | 6/2004 | Parker et al. | |
| 2006/0169910 | A1 | 8/2006 | Frosien et al. | |
| 2007/0194431 | A1 | 8/2007 | Corisis et al. | |
| 2013/0003029 | A1 | 1/2013 | Laidig | |

FOREIGN PATENT DOCUMENTS

| | | |
|---|---|---|
| CN | 101375372 A | 2/2009 |
| CN | 100465796 C | 3/2009 |
| CN | 100470298 C | 3/2009 |
| TW | 512257 B | 12/2002 |
| WO | 2010/036524 A1 | 4/2010 |

OTHER PUBLICATIONS

PCT Notification of Transmittal of the International Search Report and the Written Opinion of the International Searching Authority for International Application No. PCT/US2015/017668 dated May 29, 2015; 11 total pages.

* cited by examiner

OPTICAL IMAGING WRITER SYSTEM

CROSS REFERENCE TO RELATED APPLICATIONS

This application is a divisional application of U.S. non-provisional patent application Ser. No. 12/475,114, "An Optical Imaging Writer System" filed May 29, 2009, now U.S. Pat. No. 8,670,106 B2, issued Mar. 11, 2014, which is a continuation-in-part of, and claims priority under 35 U.S.C. §120 to United States nonprovisional patent application bearing Ser. No. 12/337,504, now U.S. Pat. No. 8,253,923 B1, issued Aug. 28, 2012, filed Dec. 17, 2008, which claims the benefit of U.S. provisional application No. 61/099,495, "An Optical Imaging Writer System" filed Sep. 23, 2008. U.S. non-provisional patent application Ser. No. 12/475,114, now U.S. Pat. No. 8,670,106 B2, issued Mar. 11, 2014, also claims the benefit of provisional application bearing Ser. No. 61/162,286, filed Mar. 21, 2009. The aforementioned United States applications are hereby incorporated by reference in their entirety.

FIELD OF THE INVENTION

The present invention relates to the field of lithography for manufacturing. In particular, the present invention relates to system and method for applying mask data patterns to substrate in a lithography manufacturing process.

BACKGROUND OF THE INVENTION

Fast-paced technology progress in semiconductor integrated circuit (IC) industry has benefited well for the manufacturing of active matrix liquid crystal display (AMLCD) TV and computer monitor displays. In the recent years, the size of LCD TV and computer monitor displays has grown to be larger and yet more affordable.

In the semiconductor IC industry, a technology generation is defined by the critical dimension (CD) of the circuit design rules. As each technology generation progresses, the IC of the later generation has smaller feature CD target and tighter tolerance. For the Flat Panel Display (FPD) industry, on the other hand, a technology generation is classified by the physical dimension of substrate used in manufacturing. In one example, the substrate sizes (in millimeter×millimeter) of FPDs sixth generation (G6) in 2005, eighth generation (G8) in 2007, and tenth generation (G10) in 2009 are 1500×1800, 2160×2460, and 2880×3080 respectively.

The lithography challenges in terms of making semiconductor ICs and FPD substrates are both trying to make larger sizes more affordable. However, they are entirely different from the manufacturing perspective. For the IC industry, a primary challenge is small CD features can be produced on a round 300 mm wafer. The goal is to pack as many transistors as possible for achieving better functionalities in the same die size. But for the FPD industry, one primary challenge is how large an entire rectangle substrate can be processed. The larger FPD substrate can be processed in a manufacturing line, the bigger size TVs or monitors can be produced with lower cost. The typical LCD TVs and monitors are designed with more sophisticated thin film transistor (TFT) for better performance. Still, the TFT CD target remains in the same specification range. In one viewpoint, one of the main challenges for FPD manufacturing is to keep throughput in pace with justifiable economics for each successive generation. Achieving profitable process yield is a key consideration, and the manufacturing process window needs to be preserved.

Conventionally, lithography technologies for manufacturing of FPD are derived from lithography process technologies for making semiconductor ICs. Majority of lithography exposure tools used for making FPD substrates are projection stepper and/or scanner systems. These are either 2-times reduction or 1-to-1 projection from mask to substrate. In order to project mask patterns to the substrate, the mask must first be made with the acceptable CD specifications. The FPD mask manufacturing process is similar to the one used for manufacturing semiconductor ICs, with the exception that the mask size for making semiconductor ICs is about 150 mm or 6 inches per side, whereas the mask size for manufacturing FPD, in one example, may be nearly 8-times larger per side, or physically more than one meter per side.

FIG. 1 illustrates a conventional configuration of projection exposure tool used for scanning mask patterns onto FPD substrate. In this configuration, the exposure sources used are mainly high pressure mercury (Hg) short-arc lamps. The incoming illumination light is reflected by a light folding mirror 102, and the reflected light passes through a mask 104, a projection lens 106 before it reaches a FPD substrate 108. The concern of using this conventional mask-based exposure tool configuration as shown in FIG. 1 for the upcoming FPD lithography manufacturing is the issue of handling the increasing physical size of masks. In one example, for the G8 FPD, the size of a mask is about 1080 mm×1230 mm. The area size of G8 substrate is four times larger. The TFT CD feature specification is in the range of 3 microns ±10%. The CD control for TFT over more-than-two-meters per side of G8 substrate is more challenging than controlling specifications for printing advanced IC features on a 300 mm silicon wafer. The challenge facing the FPD industry is to build such a mask-based exposure tool cost effectively for the upcoming FPD generations while preserving acceptable lithography process window.

To mitigate CD uniformity issue over the entire FPD exposure field, one approach is to use multiple exposures method. The nominal exposure is composed of several component exposures in adequate proportions. Each component exposure uses pre-selected wavelength for illumination along with the corresponding projection lens for scanning and stepping. More than one projection lenses need to be included in this type of exposure tool but only single illumination source is equipped. This is due to the need of using high powered Hg short-arc illumination sources in kilo Watts (KW) for throughput. The selection of exposure wavelength can be done by applying adequate filter to the source. In one example, this multi-wavelength exposure method relaxes the negative impact on CD uniformity over a G8 substrate hence allowing more economical quality of lens and illumination set-up to be used.

In using multi-wavelength exposures, it is necessary to specify more stringent CD target and uniformity on the mask itself. In one example, the TFT mask CD tolerance is under 100 nm, much smaller than otherwise necessary for the nominal 3 microns mask CD target. One reason is that the process window for FPD lithography manufacturing can be more manageable for the existing exposure tool configuration. Unfortunately, the tighter FPD mask CD specifications required would push the already costly mask set to be even more expensive. In some situations, making a critical level mask for the G8 FPD becomes very expensive and has long delivery lead time.

Yet another problem with the conventional approach is the defect density control for the use of larger sized masks. Lithography processing with such a large size mask using multiple exposures, even starting with defect free mask, is prone to introduce detrimental defects. A defect prone process impacts yield and ultimately the cost of the mask.

FIG. 2 illustrates a conventional mask making exposure tool configuration. In this exposure tool configuration, illumination light 202 is sent to a beam splitter 204 and then partially reflected to illuminate the spatial light modulator (SLM) 206 through a Fourier lens 208. Then, the imaging light rays reflected back, pass through the Fourier lens 208, the beam splitter 204, the Fourier filter 210 and the reduction lens 212, and finally reach to the mask blank substrate 216. Mask data 214 is sent to the SLM 206 electronically to set the micro-mirror pixels. The reflected light produce bright spots on the mask blank substrate 216, or otherwise absence of reflected light would produce dark spots on the mask blank substrate 216. By controlling and composing the reflections, mask data patterns can be transferred to the mask blank substrate 216.

Note that for this type of exposure tool configuration, the illumination light path is folded in order to illuminate the SLM at a right angle incidence. This folded illumination path makes a "T" joint to the exposure imaging path. In addition to high power illumination source, this type of exposure system requires using projection lens with high reduction ratio in order to write mask pattern in high accuracy and precision. Typically, the lens reduction ratio is about 100 times. Using such a high reduction ratio of lens makes the exposure field very small with a single SLM die. The physical die size for SLM is in the neighborhood of 1 cm. After a 100-times reduction, the SLM writing field is reduced to around 100 microns. This writing field size is very small and therefore slow when attempting to write a full G8 FPD mask.

Another conventional approach is to use multiple laser beams to illuminate the SLM in succession. The multiple beams are generated by reflecting a single illumination laser source from multi-faced rotating mirrors. Multiple illumination beams speed up mask writing as they make multiple exposures at a given time. With this configuration, in one instance, the time for writing a G8 FPD mask takes nearly twenty hours. Such a long write time makes machine control expensive to sustain both mechanically and electronically, hence increases the cost of the FPD mask produced. Using the same exposure tool for the upcoming G10 or beyond, the cost of manufacturing FPD masks will be even higher.

In another conventional approach, to address the mask cost issue for low volume prototyping application, one exposure tool configuration is to make use of transparent SLM as the mask. This is done such that the mask pattern can be read into SLM to show desired mask patterns without the need to make a real physical mask. The function of such a transparent SLM mask takes place of the real mask. This saves the mask cost. From the exposure tool configuration perspective, this method is essentially the same as the mask-based projection system. Unfortunately, the SLM mask has lower image quality as compared to the image quality on an actual mask. It does not meet the pattern specification requirements for FPD manufacturing.

In yet another conventional approach, a process for roll-to-roll manufacture of a display by synchronized photolithographic exposure on a substrate web is described in U.S. Pat. No. 6,906,779 (the '779 patent). The '779 patent teaches a method to expose mask pattern on a roll of substrate. In addition, another conventional method for doing roll-to-roll lithography is described in the article "High-Speed Roll-to-Toll Nanoimprint Lithography on Flexible Plastic Substrates" by Se Hyun Ahn, etc., *Wiley-VCH Verlag GmbH & Co. KGaA, Weinheim; Advanced Materials* 2008, 20, page 2044-2049 (the Ahn article).

However, in both conventional methods described above, the mask is limited to a predetermined physical size, and the physical mask dimension essentially limits the dimension of the flexible display that can be manufactured. Another problem with the conventional methods described by the 779 patent and the Ahn article is that, to achieve a reasonable printing result, the roll of substrate must be stretched flat during the exposure stage. As a result, the surface flatness of the substrate is not as good as rigid glass substrate, typically used for LCD TV display. With such a mask-based lithography, the depth of focus (DOF) is limited due to uneven substrate surface. Thus, it can be very challenging for these conventional methods to pattern TFT feature critical dimension (CD) at 5 µm or less. To achieve decent definition display based on TFT, it is necessary to have CD for TFT mask pattern in the neighborhood of 3 µm.

The challenges discussed previously for the manufacturing of future generations of FPDs are driven by the need for cost reduction for the FPD industry. One key motivation is to achieve cost efficiency when the newer manufacturing generation is being adopted. Lithography process requires maintaining throughput efficiency while assuring product yield better than previous generations. This demands wider lithography process window and fewer process defects while contending with bigger FPD substrates. As discussed above, there are numerous shortcomings with the existing exposure tool configurations. One of the major shortcomings is associated with the use of a mask. The size of the mask is too large to be manufactured cost effectively. This shortcoming continues to grow as the size of the mask must increase in order to keep up with future generations of FPDs. Therefore, there is a need for an improved imaging writer system that addresses the issues of the conventional tools and approaches.

SUMMARY

The present invention relates to systems and methods for applying mask data patterns to substrate in a lithography manufacturing process. In one embodiment, the imaging system includes a plurality of spatial light modulator (SLM) imaging units, where each of the plurality of SLM imaging units includes one or more illumination sources, one or more alignment sources, one or more projection lenses, and a plurality of micro mirrors configured to project light from the one or more illumination sources to the corresponding one or more projection lens. The imaging system further includes a controller configured to control the plurality of SLM imaging units, where the controller tunes each of the SLM imaging unit individually in writing a mask data to a substrate in a lithography manufacturing process.

In another embodiment, a parallel imaging writer system includes a plurality of spatial light modulator (SLM) imaging units, where each of the plurality of SLM imaging units includes one or more illumination sources, one or more alignment sources, one or more projection lenses, and a plurality of micro mirrors configured to project light from the one or more illumination sources to the corresponding one or more projection lens. The parallel image writer system further includes a controller configured to control the plurality of SLM imaging units, where the controller further includes logic for receiving a mask data pattern to be written to a substrate, logic for processing the mask data pattern to form a plurality of partitioned mask data patterns corresponding to different areas of the substrate, logic for assigning one or more SLM imaging units to handle each of the partitioned mask data pattern, and logic for controlling the plurality of SLM imaging units to write the plurality of partitioned mask data patterns to the substrate in parallel.

In yet another embodiment, a method for applying mask data patterns to substrate in a lithography manufacturing process includes providing a parallel imaging writer system, where the parallel imaging writer system includes a plurality of SLM imaging units arranged in one or more parallel arrays, receiving a mask data pattern to be written to a substrate, processing the mask data pattern to form a plurality of partitioned mask data patterns corresponding to different areas of the substrate, assigning one or more SLM imaging units to handle each of the partitioned mask data pattern, and controlling the plurality of SLM imaging units to write the plurality of partitioned mask data patterns to the substrate in parallel.

In yet another embodiment, a method for applying mask data patterns to substrate in a lithography manufacturing process includes providing a parallel imaging writer system which has a plurality of spatial light modulator (SLM) imaging units arranged in one or more parallel arrays; receiving a mask data pattern to be written to a substrate, processing the mask data pattern to form a plurality of partitioned mask data patterns corresponding to different areas of the substrate, assigning one or more SLM imaging units to handle each of the partitioned mask data pattern, controlling the plurality of SLM imaging units to write the plurality of partitioned mask data patterns to the substrate in parallel, controlling movement of the plurality of SLM imaging units to cover the different areas of the substrate, and controlling movement of the substrate to be in synchronization with continuous writing of the plurality of partitioned mask data patterns.

In yet another embodiment, a parallel imaging writer system includes a plurality of spatial light modulator (SLM) imaging units, where each of the plurality of SLM imaging units includes one or more illumination sources, one or more alignment sources, one or more projection lenses, and a plurality of micro mirrors configured to project light from the one or more illumination sources to the corresponding one or more projection lens. The parallel imaging writer system further includes a controller configured to control the plurality of SLM imaging units, and the controller synchronizes movements of the plurality of SLM imaging units with movement of a substrate in writing a mask data to the substrate in a lithography manufacturing process.

BRIEF DESCRIPTION OF THE DRAWINGS

The aforementioned features and advantages of the invention, as well as additional features and advantages thereof, will be more clearly understandable after reading detailed descriptions of embodiments of the invention in conjunction with the following drawings.

Like numbers are used throughout the specification.

DESCRIPTION OF EMBODIMENTS

System and method are provided for applying mask data patterns to substrate in a lithography manufacturing process. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the detailed description that follows are presented in terms of flowcharts, logic blocks, and other symbolic representations of operations on information that can be performed on a computer system. A procedure, computer-executed step, logic block, process, etc., is here conceived to be a self-consistent sequence of one or more steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

Embodiments of the present invention use spatial light modulator (SLM) based image project devices. Two types of SLM based image projection may be used, one is the digital micro-mirror device (DMD) and the other is the grating light valve (GLV). Both types of devices may be produced by using micro-electro-mechanical (MEM) manufacturing methods.

Figure 3:
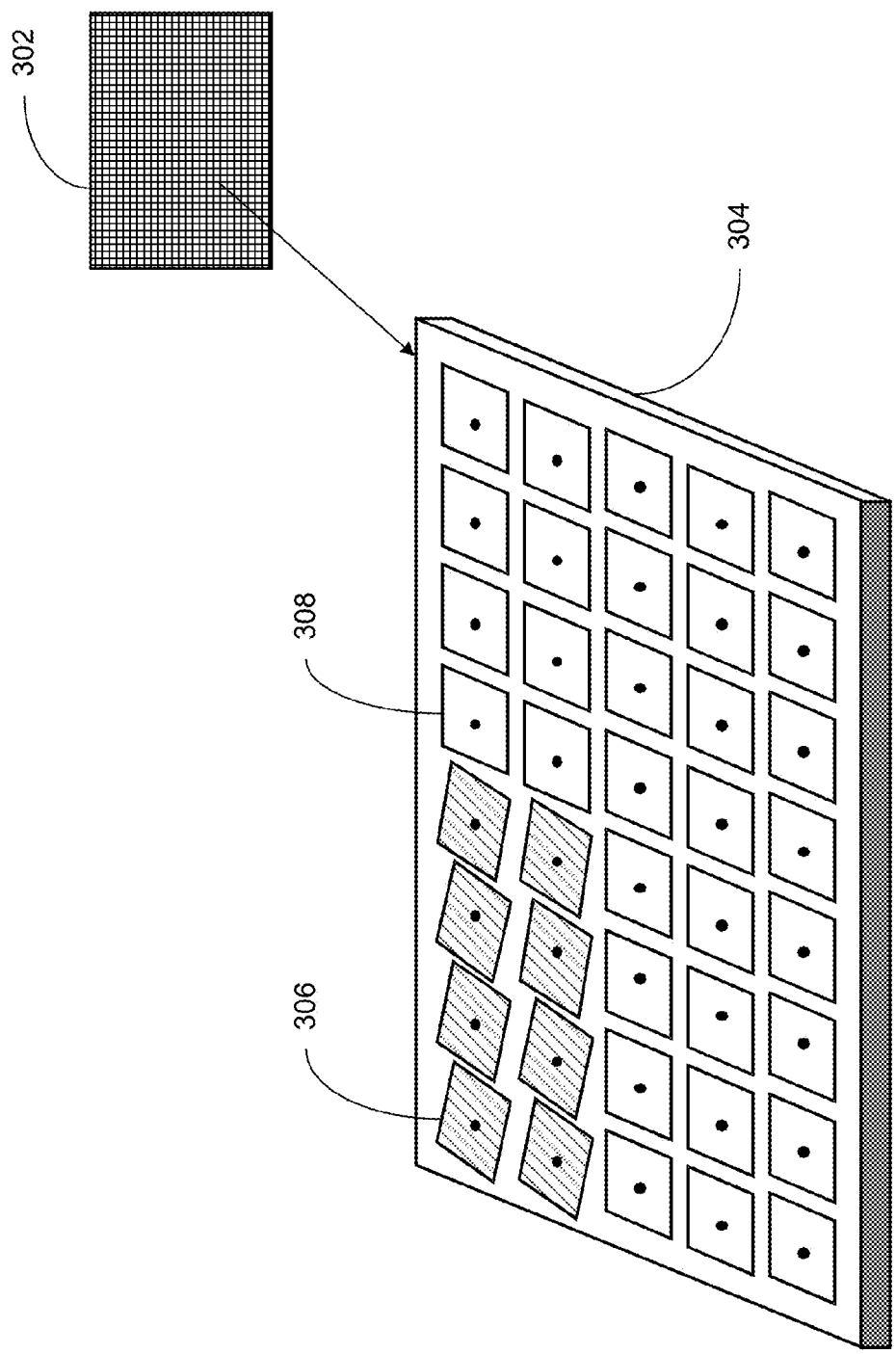
FIG. 3 illustrates an exemplary digital micro-mirror device according to embodiments of the present invention.

FIG. 3 illustrates an exemplary digital micro-mirror device according to embodiments of the present invention. In this example, a single DMD die is represented by numeral 302 and an enlarged and simplified view of the same DMD die is represented by numeral 304. DMD can be addressed by tilting micro-mirrors in fixed angles, typically around ±10° or ±12°, to act as spatial light modulator (SLM). The mirror surface of DMD is highly reflective to the incident illumination. Each micro-mirror can be manipulated to tilt (represented by numeral 306) or left un-changed (represented by numeral 308) by the transistor controller underneath. In one implementation, DMD may have pitch dimension of about 14 µm with about 1 µm space between each micro-mirror. The pixel count on a single DMD die may be 1920×1080 mirror pixels, compatible to high definition television (HDTV) display specifications.

Figure 4:
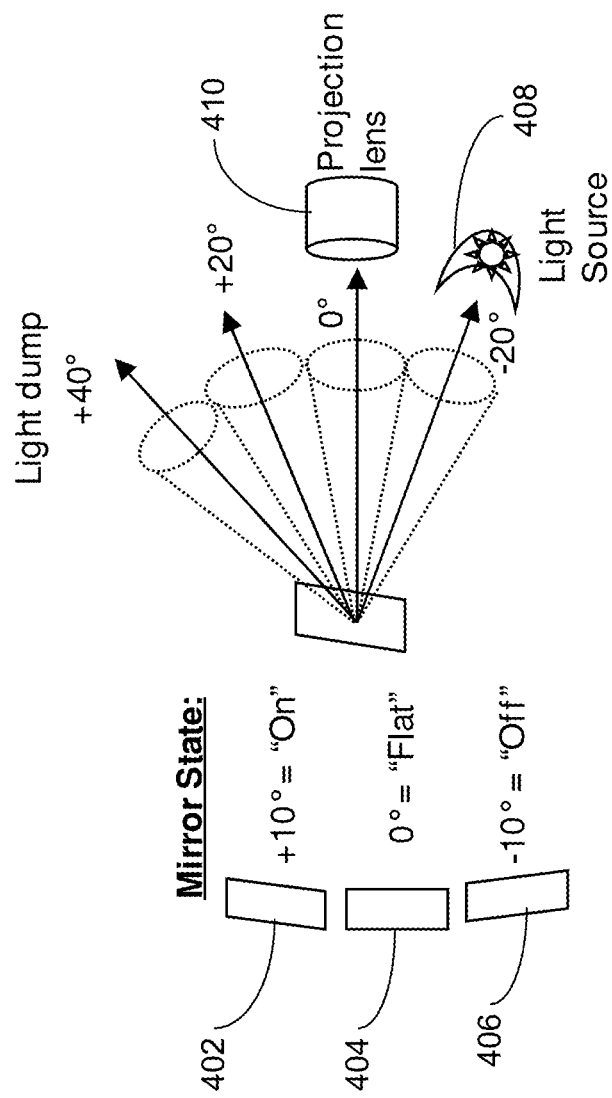
FIG. 4 illustrates a DMD-based projection system according to embodiments of the present invention.

FIG. 4 illustrates a DMD-based projection system according to embodiments of the present invention. In this example, the micro-mirror has three states: 1) "On" State 402 at about +10° tilting angle, 2) "Flat" State 404 at no tilt, and 3) "Off" State 406 at about −10° tilting angle. When a ray of light beams shine from a light source 408 located at −20° angle to the DMD, they can reflect light beams directly to pass through projection lens 410 to form bright spots on the display substrate, for the mirrors that are at "On" State or "1" in binary. For mirrors that are at "Flat" State and "Off" State, or the "0", the light beams reflected in an angle falling outside of the collection cone of the projection lens, at approximately −20° and −40° respectively. Hence no light pass though from those mirror sites, dark spots are then formed on the display substrate. Since each of micro-mirror reflection cannot be visually resolvable by human eyes, a gray shade can be constructed by combining a group of light and dark spot pixels in a ratio when projected. This method enables the projection of realistic images with million shades of grays and colors.

Note that the higher diffraction orders of diffraction beam from the "Flat" State and the $2^{nd}$ order of diffraction beam from the "Off" State can still fall within the collection cone angle of the projection lens. This may create unwanted flare that reduces the desire image contrast. According to embodiments of the present invention, a precisely aimed and focused high intensity illumination source may be used to increase the pixel diffraction efficiency to optimize the design of the projection optics using DMD for imaging writer.

According to other embodiments of the present invention, GLV is another approach for implementing image projection. The top layer of GLV device is a linear array of materials, also referred to as ribbons, which are highly reflective. In one embodiment, ribbons may be 100-1000 µm long, 1-10 µm wide and closely spaced by 0.5 µm. The imaging mechanism of GLV is essentially addressable dynamic diffraction grating. It functions as a phase modulator. A GLV device may include a group of six alternative ribbons deflected to form dynamic diffraction grating.

Figure 5:
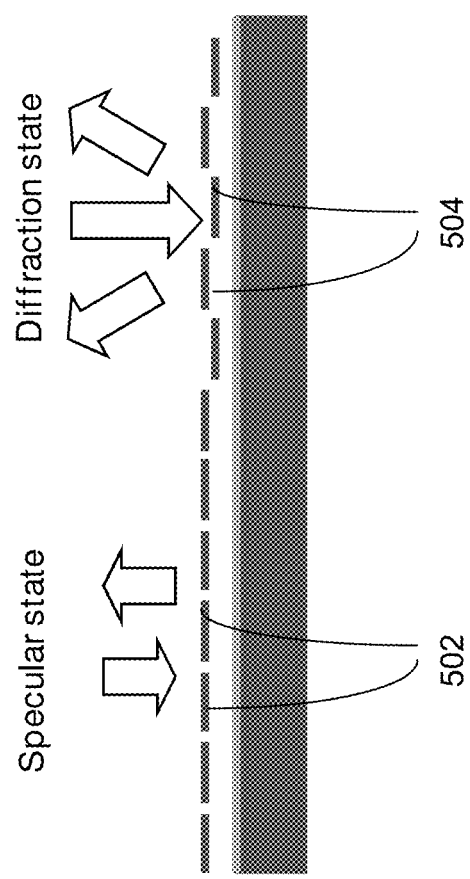
FIG. 5 illustrates an exemplary specular state and diffraction state of a grating light valve (GLV) device according to embodiments of the present invention.

FIG. 5 illustrates an exemplary specular state and diffraction state of a GLV device according to embodiments of the present invention. When the GLV ribbons (in cross-sectional view) are co-planar (represented by numeral 502), the incident light is reflected specularly, i.e. all in the $0^{th}$ diffraction order. When incident light shines on a group of ribbons, where ribbons are deflected in an alternating fashion (represented by numeral 504), and a diffraction pattern is formed with strong $\pm 1^{st}$ orders but with suppressed $0^{th}$ order. A high contrast reflection image can be constructed by filtering out either $0^{th}$ or $\pm 1^{st}$ orders. That is, no image may be formed if to re-capture all of $0^{th}$ or $\pm 1^{st}$ orders in the objective lens. Unlike DMD, the entire image in a field of view as formed by GLV is based on scanning line by line since there may be one line of diffraction images are formed by the linear array of grating ribbons at one time.

Figure 1:
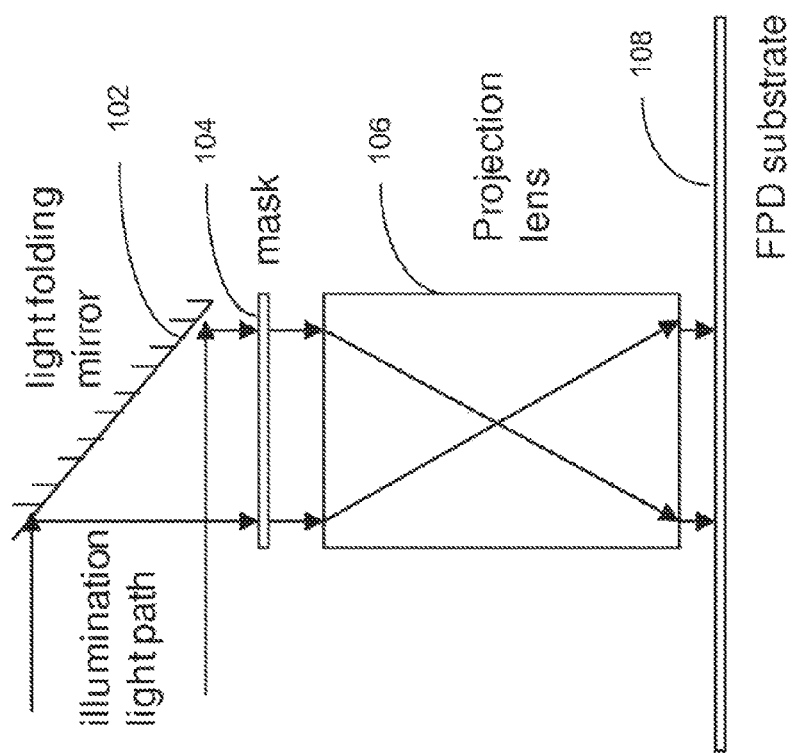
FIG. 1 illustrates a conventional configuration of projection exposure tool used for scanning mask patterns onto FPD substrate.
Figure 2:
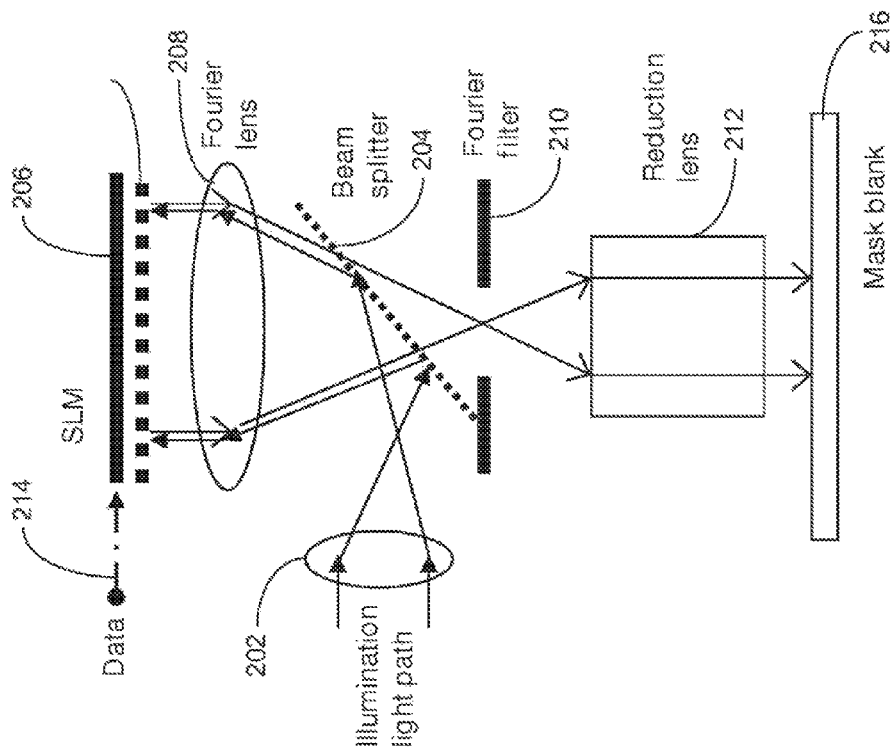
FIG. 2 illustrates a conventional mask making exposure tool configuration.

As discussed in association with FIG. 1 and FIG. 2, in order to achieve the throughput requirements, high powered illumination sources for the conventional systems are necessary. In one example, high pressure Hg short-arc lamp in the kilo-Watts range is used. Another example is to use high powered Excimer laser. Due to the use of high power illumination sources, the illumination light path needs to be directed from a distance to reduce the heat generated and then be folded for a right illumination. This type of configuration separates the illumination and SLM imaging system into two separate units and the light path and the lens are perpendicular to each other.

To address the limitation of the conventional systems and approaches, the improved exposure tool configuration reduces the need to use high-powered illumination sources. An in-line imaging system is configured where each of the imaging unit includes the SLM, the illumination sources, the alignment illumination, the electronic control, and the imaging lens. This system may have a lower exposure throughput when using low powered LED and diode laser illumination sources. However, the exposure throughput may be increased by using a larger number of imaging units. One of the benefits of using a compact SLM imaging unit is that a scalable array of such units may be packed for different imaging applications. In one application example, when arrayed with more than 1000 such compact SLM imaging units, the writing throughput exceeds the existing multi-wavelength, mask-based exposure tool configuration.

Figure 6:
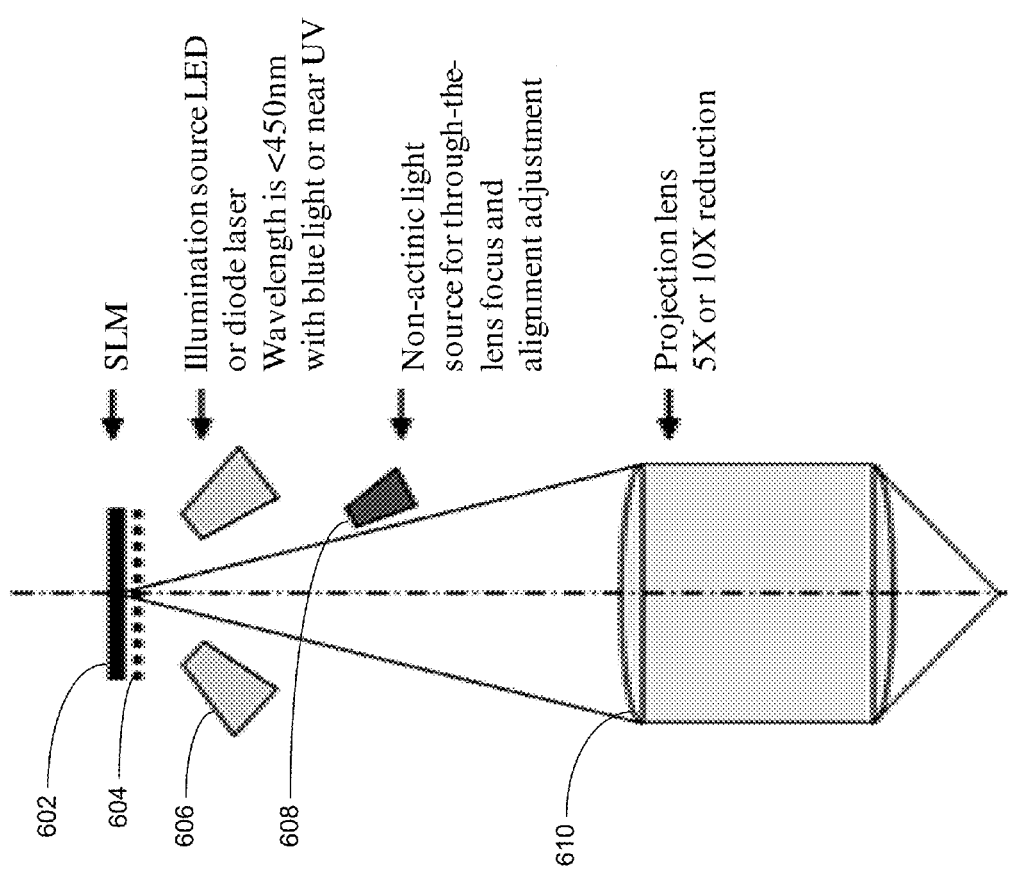
FIG. 6 illustrates an example of a compact SLM imaging unit according to embodiments of the present invention.

FIG. 6 illustrates an example of a compact SLM imaging unit according to embodiments of the present invention. In this example, the compact SLM imaging unit includes a spatial light modulator 602, a set of micro-mirrors 604, one or more illumination sources 606, one or more alignment light sources 608, and a projection lens 610. The illumination source 606 may be implemented with LED or diode laser having wavelength less than 450 nm with blue light or near UV. The alignment light source 608 may be implemented with a non-actinic laser source or LED for through-the-lens focus and alignment adjustment. The projection lens 610 may be implemented with a lens having a 5× or 10× reductions. As shown in FIG. 6, the illumination sources 606 and the alignment light source 608 are all placed outside of the collection cone angle of the projection lens. In this exemplary implementation, off-the-shelf projection lenses with numerical aperture NA of 0.25 at resolving power of about 1 μm may be used. The relatively low NA ensures better depth of focus (DOF). In one lithography process example, using NA of 0.25 for 1 μm photo resist CD target, the DOF may be >5.0 μm. The resolution and DOF calculations are based on Rayleigh criterion:

$$\text{Minimum feature resolution} = k_1(\lambda/NA)$$

$$DOF = k_2(\lambda/NA^2)$$

where, $k_1$ and $k_2$ are process capability factors. According to an implementation of lithography manufacturing process based on Novolak chemistry photoresist, $k_1$ is in the range from 0.5 to 0.7, $k_2$ is from 0.7 to 0.9, and λ refers to the exposure wavelength.

In order to fit a compact form factor, illumination sources may be blue, near UV LED, or semiconductor diode laser. To get sufficient intensity, in one design example, the illumination sources are placed close to the SLM surface and there may be multiple illumination sources placed surrounding the SLM. The SLM may be DMD or GLV with proper optical lens design matched to each. In one example, the targeted intensity level at the substrate may be between 10-100 mW per square centimeter of the actinic exposure wavelength.

In this exposure tool configuration example, the housing for the electronic control boards for each compact imaging system conforms to a specified compact factor. It is located on the top of the SLM, away from the illumination sources. This facilitates ventilation and heat dissipation. The physical dimension for a single compact SLM imaging unit depends on the required imaging performance and the available components use off-the-shelf supply, such as the projection lens, LED or diode laser illumination sources, and focus/alignment diode laser, each with required room for heat dissipation. Another approach is to have custom design for the components so that the physical dimension for a single SLM imaging unit can be trimmed to an even more compact form. A custom designed SLM imaging unit may have a dimension of approximately 5 cm×5 cm in 2D cross-section compared to a dimension of approximately 10 cm×10 cm using off-the-shelf supply.

Figure 7:
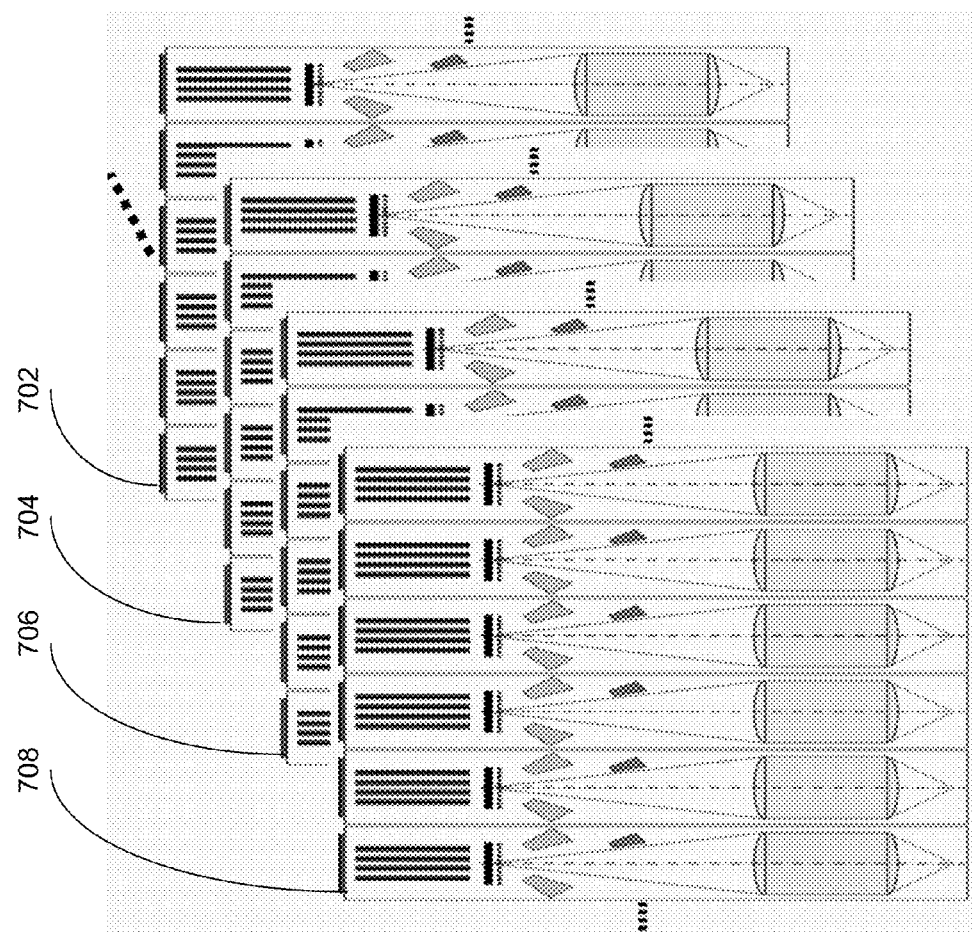
FIG. 7 illustrates an exemplary parallel array of SLM imaging units according to embodiments of the present invention.

For the G10 FPD manufacturing, a typical substrate size is 2880 mm×3130 mm. Using the physical dimension of compact SLM imaging lens, a system may include hundreds of compact SLM imaging units arranged into an array of parallel imaging units. FIG. 7 illustrates an exemplary parallel array of SLM imaging units according to embodiments of the present invention. In this example, the image writing can be performed by 600 to 2400 parallel arrays of SLM imaging units (702, 704, 706, 708, etc.) simultaneously and each parallel array may includes multiple SLM imaging units.

According to embodiments of the present invention, the exposure throughput may be determined using a known example throughput of a SLM mask writer, such as 20 hours for the mask size of 1300 mm×1500 mm, may be used as a starting point. Throughput depends on the intensity level at the substrate plane. In this approach, for the intensity level of 50 mW per square centimeter, achievable with LED or diode laser sources, and for the nominal exposure energy of 30 mJ/sq-cm-sec, the exposure time is approximately 0.6 seconds. In another approach, where the exposure tool uses high-powered illumination source, the intensity level at the substrate is at least 200 mW per square centimeter or higher. The throughput for such a mask-based stepper/scanner system is about 50 G8 FPD substrate plates per hour. By taking into account of both high-powered and low-powered illumination sources, the throughput estimation in one example is from 25 to 100 substrates per hour, depending on the density of parallel SLM imaging units used in the array. This shows that such an array parallel exposure configuration is competitive economically.

Figure 8:
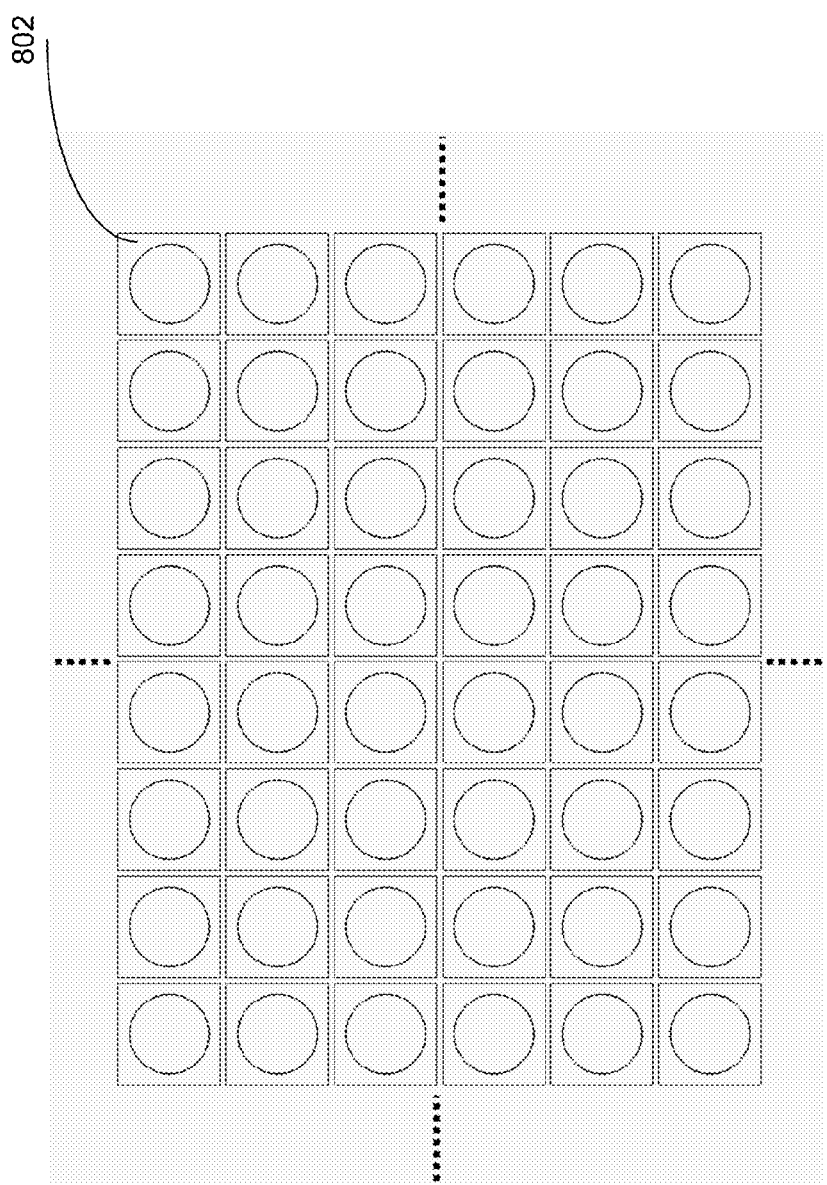
FIG. 8 illustrates the corresponding top-down view of the parallel array of SLM imaging units of FIG. 7 according to embodiments of the present invention.

FIG. 8 illustrates the corresponding top-down view of the parallel array of SLM imaging units of FIG. 7 according to embodiments of the present invention. In this example, each row or column may represent a parallel array of SLM imaging units, and each parallel array may include multiple SLM imaging units 802. Lithography manufacturing yield is directly related to process window. Here process window refers to the range focus settings in conjunction with the range of exposure dose settings that can print feature CDs within the specifications. That is, for a more robust process window, it can tolerate wider defocus settings and/or exposure dose settings. A wider process window may produce a better product yield. With bigger substrate for each newer generation, lithography window becomes smaller. This is mainly due to the more tendencies for larger and thinner substrate material to warp or sag. To address this issue, the solution calls for tightening thickness and surface uniformity specifications for substrate material. For mask-based exposure tool, maintaining uniformity and focus control over an exposure field that is larger than about two meters in one side is not only very expensive but also technologically challenging. To assure a workable process window, exposure tool need to be able to optimize focus and illumination in both local and global fashions.

As shown in FIG. 8, this array parallel exposure system addresses the issues discussed above. This is because each of the compact SLM imaging units can be optimized locally for better illumination and focus corresponding to its own exposure area. That ensures a better process window in each exposure area of the SLM imaging unit. The entire process window is then improved globally using optimized contributions from the SLM imaging units.

Figure 9:
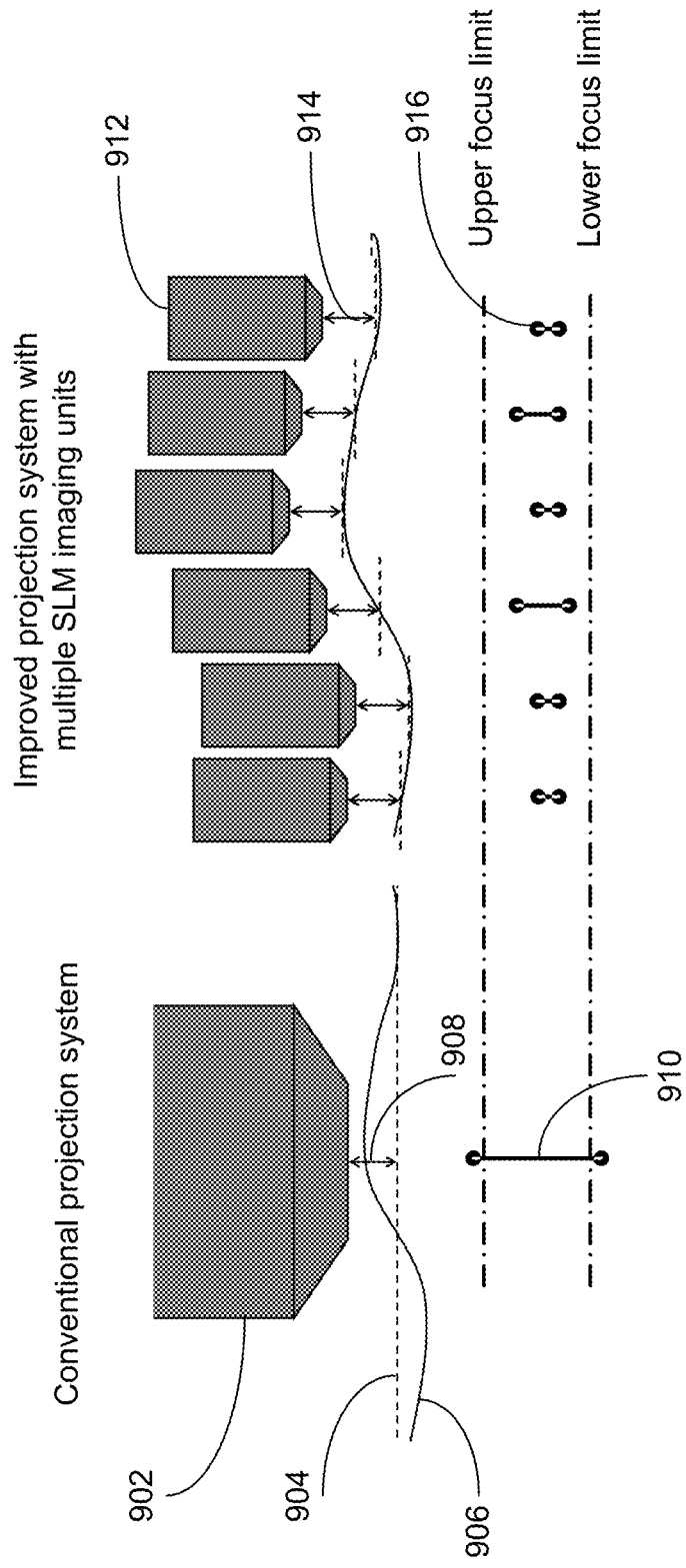
FIG. 9 illustrates a comparison of a conventional single lens projection system versus the localized process window optimization using the arrayed imaging system according to embodiments of the present invention.

FIG. 9 illustrates a comparison of a conventional single lens projection system versus the localized process window optimization using the arrayed imaging system according to embodiments of the present invention. On the left hand side of FIG. 9, the conventional single lens projection system 902 must be tuned to a compromised focal plane 904, as shown in dotted line. The solid line 906 represents the actual surface contour of the substrate in cross-sectional view. The double arrow 908 indicates the best focus setting corresponding to a single lens that is used to image the pattern. The lines with round heads 910 represent the maximum contour range correspond to each imaging lens and the dot-dashed lines indicate the upper and lower limits of the focus range.

As shown in FIG. 9, for the conventional single lens projection system, the large-sized substrate curvature may have already exceeded the focus range of the lens. The center of focus may be only marginally acceptable with respect to both of the peak and valley curvatures in the substrate. The overall process window becomes limited. On the other hand, the right hand side of FIG. 9 shows an improved projection system with imaging units arranged in an array. The focus 914 of an imaging unit 912 can be tuned individually for each localized area covered. As a result, each focus setting can be placed well within the focus control limits as represented by the lines 916. In addition to the ability to fine tune focus in each of the local area covered, the illumination of each imaging unit may also be adjusted to achieve a better uniformity compared to the adjustment may be performed by a single lens system. Therefore, a more robust process window is achieved by using the arrayed imaging unit system.

Figure 10:
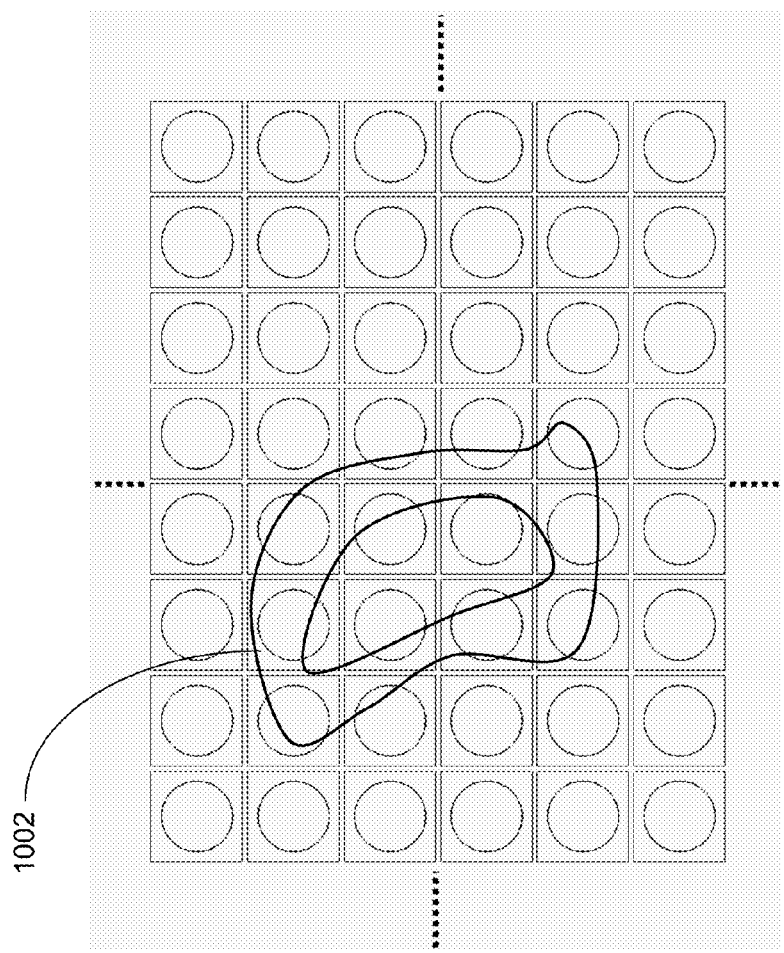
FIG. 10 illustrates a method for optimizing localized unevenness in substrate according to embodiments of the present invention.

FIG. 10 illustrates a method for optimizing localized unevenness in substrate according to embodiments of the present invention. In this example, region of uneven contours are detected in the substrate as indicated by numeral 1002. One method of tuning optimization is to apply a focus averaging scheme for the uneven local exposure areas that are associated with a SLM imaging unit as well as the surrounding areas associated with SLM imaging units in the neighborhood of the SLM imaging unit of interest. The more imaging units in the neighborhood of the uneven areas that can be included for averaging, the better globalized optimization can be achieved. A person skilled in the art would appreciate that other averaging techniques may be applied to the disclosed imaging system for the entire substrate plate to achieve a more uniform image globally across the whole substrate.

In one implementation, the mask data format for thin film transistor (TFT) based LCD display may be implemented as follows. Note that the hierarchical stream data format GDSII may be used for taping out mask data, but this type of mask data format may not be well-suited for this parallel SLM imaging system. To convert from hierarchal mask data to flat format, this can be done by using an off-the-shelf CAD software program. However, after flattened the mask data, further processing the mask data is needed. Mask data structure is used in conjunction with the arrayed parallel imaging writer system to produce higher quality images.

For the arrayed parallel imaging writer system, the mask data structure may be flattened and may be partitioned into pieces of a predefined size to properly or evenly feed to every SLM imaging unit. The mask data structure includes information that indicates the placement for each piece of mask data relative to its respective imaging unit. Moreover, the mask data structure includes information that specifies how features that span multiple imaging units will be divided among them. The data placement tuning can be recognized via the mask data structure that is related to the adjacent mask data areas from the adjacent imaging units.

Figure 11:
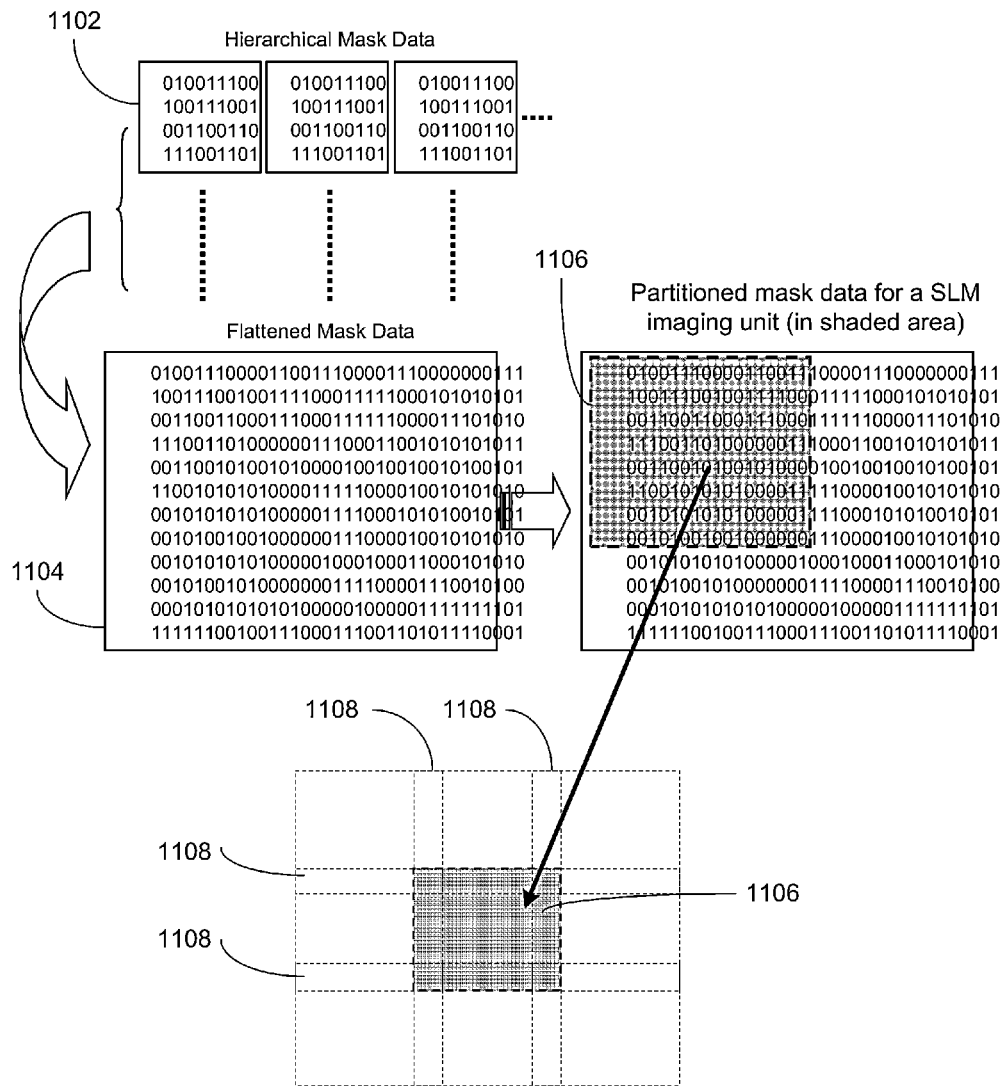
FIG. 11 illustrates an application of a mask data structure according to embodiments of the present invention.

FIG. 11 illustrates an application of a mask data structure according to embodiments of the present invention. In this example, a hierarchical description of a mask data in terms of multiple levels of mask data instances 1102 is first flattened to form a flattened mask data 1104. Then, the flattened mask data 1104 is partitioned into multiple partitioned mask data patterns. One such partitioned mask data pattern is shown as a shaded area 1106, which is also shown as the center block in the nine blocks (separated by dotted lines) at the bottom of FIG. 11. Sufficient mask patterning overlaps between the adjacent imaging units, shown as horizontal and vertical strips 1108, are needed to ensure uniform pattern blending around the borders, where each block represents a partitioned mask data to be imaged by one or more SLM imaging units. According to embodiments of the present invention, the partitioned mask data includes a first set of identifiers for identifying run-in conditions of mirror pixels within a SLM imaging unit and a second set of identifiers for identifying run-out conditions of mirror pixels within a SLM imaging unit. A run-in condition occurs where excessive pixels are found in an area between two SLM imaging units. A run-out condition occurs where insufficient pixels are found in an area between two SLM imaging units. Each partitioned mask data pattern is fed to its corresponding SLM imaging unit for processing, where each SLM imaging unit writes its associated partitioned mask data pattern in predetermined overlapped areas using adjacent SLM imaging units as references to ensure the imaging blending and uniformity meet design criteria. The partitioned mask data pattern may be optimized to enable parallel voting exposures for feature CD uniformity. In this case, a parallel voting exposure scheme is used in minimizing processing variables that may negatively impact CD uniformity. The elimination of Gaussian speckles due to the use of diode laser is accomplished by using sufficient number of micro-mirror pixel exposures for voting.

Figure 12:
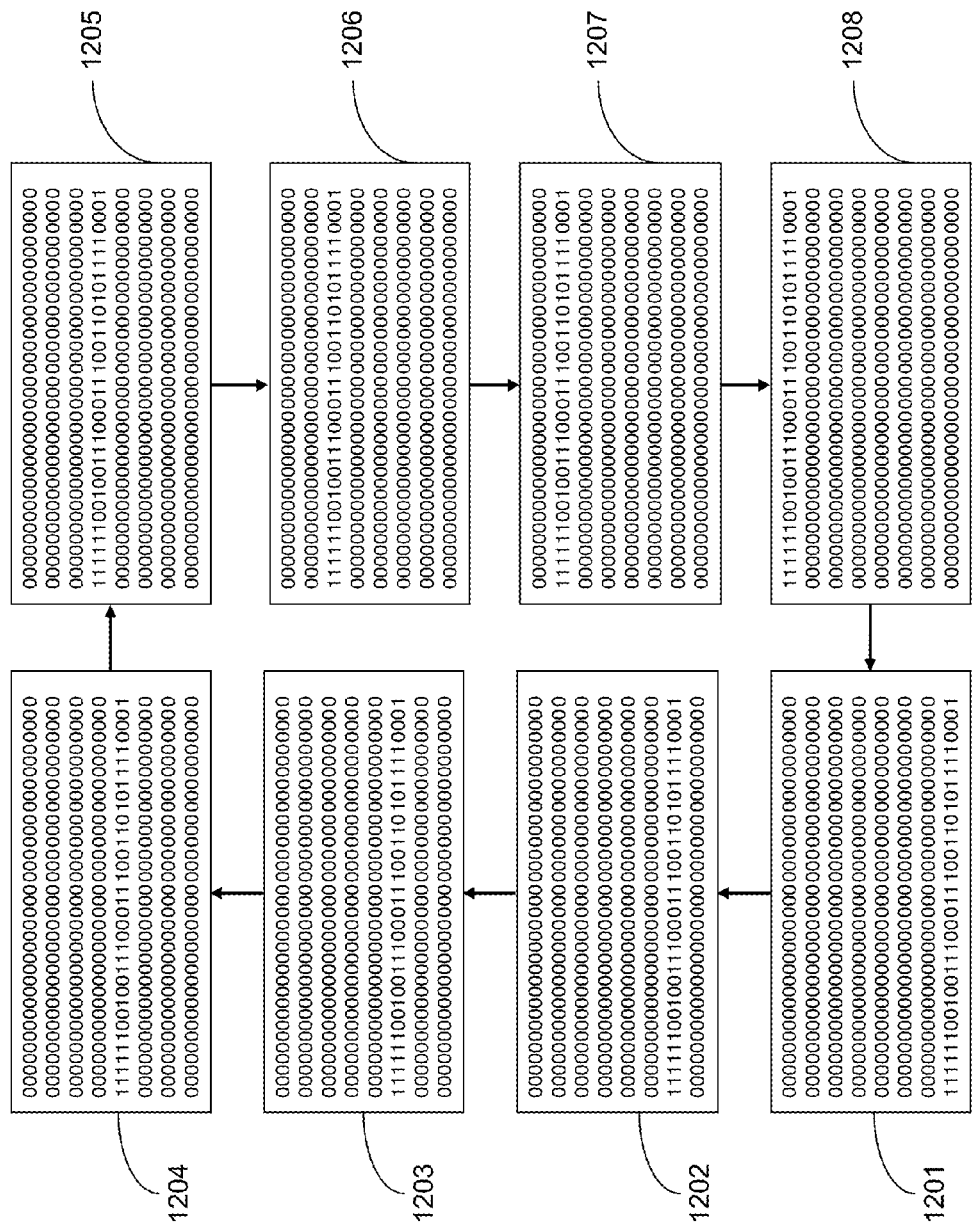
FIG. 12 illustrates a method of parallel array voting exposures according to embodiments of the present invention.

FIG. 12 illustrates a method of parallel array voting exposures according to embodiments of the present invention. The method first sends the mask data to each of SLM imaging unit in a row-by-row fashion, then to flash the row of micro-mirror pixels starting from one end of the row to the next until reaching the opposite end. In one example, the method starts with block 1201 and flashes the bottom row of micro-mirror pixels. It then moves block 1202 and flashes the second row from the bottom row of micro-mirror pixels. In block 1203, the third row from the bottom row of micro-mirror pixels is flashed. The method continues through blocks 1204, 1205, 1206, 1207 and flashes the corresponding row of micro-mirror pixels. And in block 1208, the method has traversed the last row of micro-mirror pixels (which is the top row) in this particular example. The same walking-row of micro-mirror pixels loops again and again from the start to the end. The looping of the walking-row corresponds to exposure actions for writing patterns on substrate. Because micro-mirror flashing rate is fast enough, the feature patterns are exposed by the fast moving walking-row numerous times until nominal exposures level is accumulated. Thus, such a pattern writing scheme is, in effect, done by voted exposures from numerous micro-mirror pixels. By moving substrate stage in a coordinated pace and orientation, the writing for entire substrate is carried out with the same voting exposure scheme.

The walking-row approach illustrated in FIG. 12 is one example of looping walking-row for making one style of parallel voting exposure locally or sub-locally for every imaging unit. In other embodiments, looping methods based on column or diagonal row/column may be used for effective parallel voting exposures. Additional voting schemes can be derived such as interlaced walking-rows from the two adjacent SLM imaging units or to use multiple walking orientations with several data rows, etc., may be employed to improve printing performance, although possibly at the expense of additional stage motion.

For array parallel exposure under heavy production environment, redundancy or fault-tolerance may be built-in to prevent production flow from interruption. That is, as the exposure control routine detects a failure of an SLM imaging unit, it then takes action to disable the problematic imaging unit, redistributes the mask data to one or more of the adjacent imaging units, and then has these adjacent imaging units complete the exposure tasks before unloading the exposed plate. This corrective exposure routine continues until the full batch-load of plates is done. The process continues until both the imaging performance and throughput hit are considered acceptable.

Figure 13:
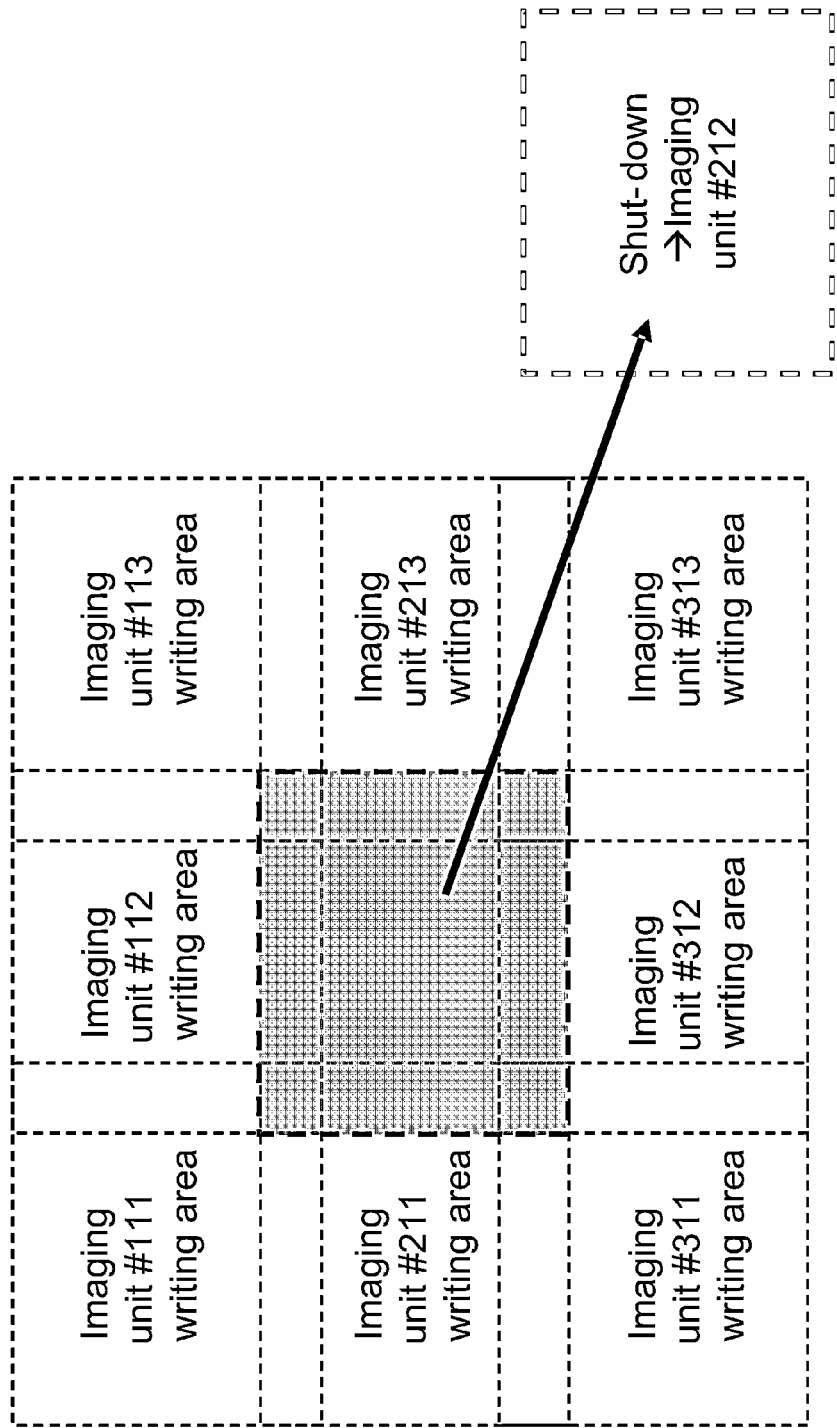
FIG. 13 illustrates a method for implementing redundancy in the imaging writer system according to embodiments of the present invention.

FIG. 13 illustrates a method for implementing redundancy in the imaging writer system according to embodiments of the present invention. In this example, after detecting that image unit 212 has malfunctioned, this unit is shut down. One of the 8 adjacent imaging units may be selected to take over. In this case, the writing for the unit 212 area is done after exposures of other areas have been accomplished.

Figure 14:
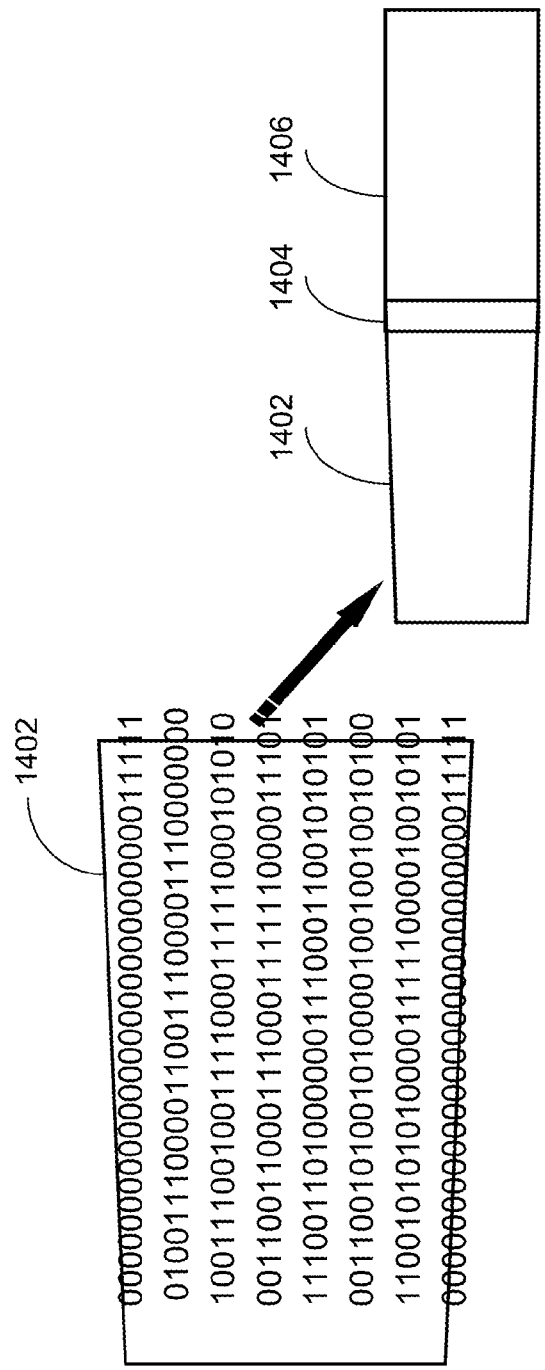
FIG. 14 illustrates the Keystone border blending method according to embodiments of the present invention.

Micro mismatched (local to local) borders from the two adjacent SLM imaging units can occur when imaging distortions result from substrate warping or sagging. This is represented by numeral 1402, where data patterns fall outside of the boxed area. In this case, the pattern blending in the overlapped areas needs to be optimized. FIG. 14 illustrates the Keystone border blending method according to embodiments of the present invention. As shown in FIG. 14, the method turns on micro-mirror pixels at the selected border end 1404 that allows better overlap matching to the adjacent imaging unit writing area 1406. Persons skilled in the art would appreciate that other approaches may be used to achieve border blending by turning on micro-mirror pixels selectively at desired sites.

According to some embodiments, blending may be performed by turning on selected micro-mirror pixels in alternate or complementary manner between the adjacent overlapping borders. According to yet some other embodiments of the present invention, mixing walking-row exposure voting action together with additional pixel turning at selected sites may be used to achieve better blending.

In order to achieve the intended alignment accuracy and precision for the array parallel imaging system, the method decomposes the alignment scheme into several accuracy precision levels in cascade. First alignment level is to aim for global alignment accuracy level, next is to narrow into intermediate level of accuracy precision. Using this bottom-up approach, the method achieves the desired accuracy precision level.

Figure 15:
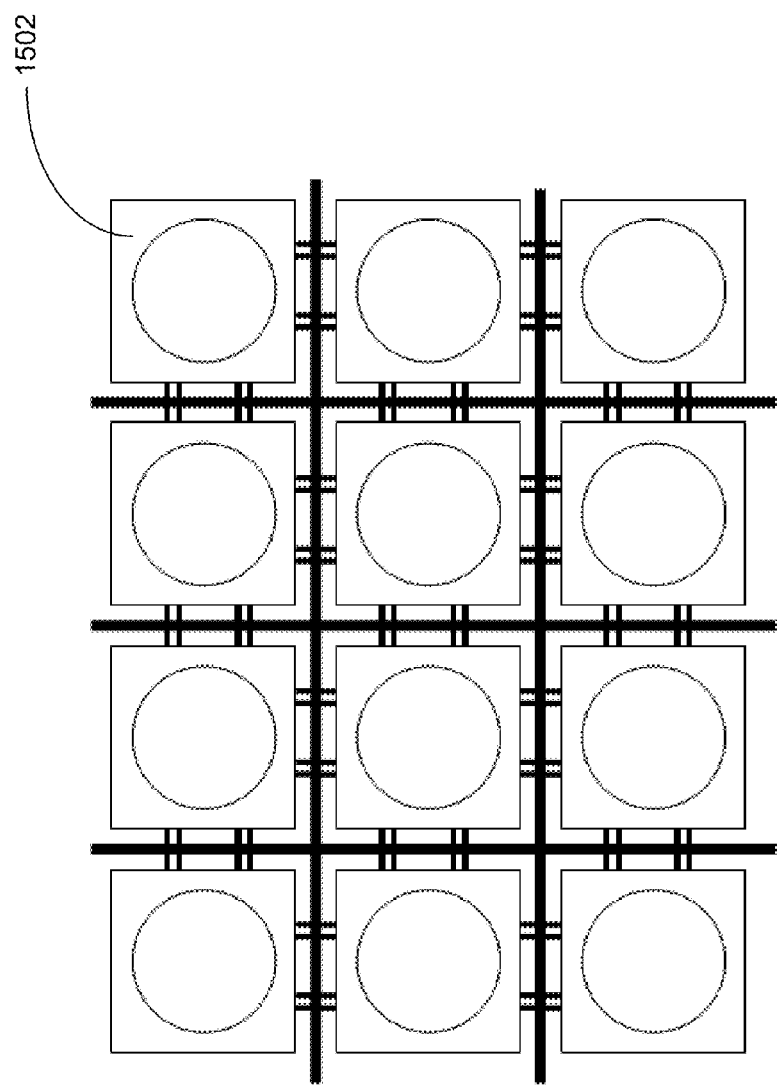
FIG. 15 illustrates a method for placing SLM imaging units in an array according to embodiment of the present invention.

In one approach, three accuracy precision levels are defined: the unit lens array placement, the lens center tuning, and the micro-mirror imaging data manipulation. FIG. 15 illustrates a method for placing SLM imaging units in an array according to embodiment of the present invention. This method provides global placement accuracy of the SLM imaging units 1502 in the millimeters range. Next, for each SLM imaging unit, the position of projection lens assembly is electronically tuned to precision in micrometer range. This is done by aligning the lens center using HeNe laser (or other non-actinic alignment light source) to a known reference position on the stage. Finally the micro-mirrors are controlled to achieve alignment requirements in precision of nanometer range.

According to embodiments of the present invention, the alignment process for making exposure may be carried out as follows:

1) Using a known reference site on the stage, the lens center for each SLM imaging unit in the array is first calibrated. This allows constructing a mathematical grid array points in reference to the physical lens array.

2) For the first masking layer, when there is no alignment marks printed, the plate alignment is done mechanically relying mainly on the stage precision.

3) When the substrate plate has alignment marks throughout the plate as printed from the previous masking layer, these alignment marks can be detected by the corresponding SLM imaging units. From this, a grid map is constructed in reference to the actual image locations that are on the substrate plate.

4) By comparing the two grid maps (SLM imaging unit vs. printed alignment marks detected from the substrate), build a grid map matching mathematical model for stage travel guide.

5) In one example, by considering 2400 array SLM imaging units for G10 substrate, the maximum stage travel distance is about 120 mm in either horizontal (X) or vertical (Y) direction. This is included for grid map matching calculation. Note that such a stage travel distance is rather small hence technologically advantageous compared to making the stage travels in full plate width and length required by using mask-based exposure tool for the G10. The G10 plate substrate can have a heavy mass. The shorter stage distance traveled while carrying such a heavy mass, the better system accuracy performance may be achieved.

6) To fine-tune sub-micron alignment accuracy, the method embeds the correction factors into the mask data that is being sent to the corresponding imaging unit. That is, the correction factors for every imaging unit may be different depending on the relative imaging locations on the substrate. They can also be different from plate to plate since the substrate warping condition may be different and may be detected ahead of the time before exposing each plate.

Figure 16:
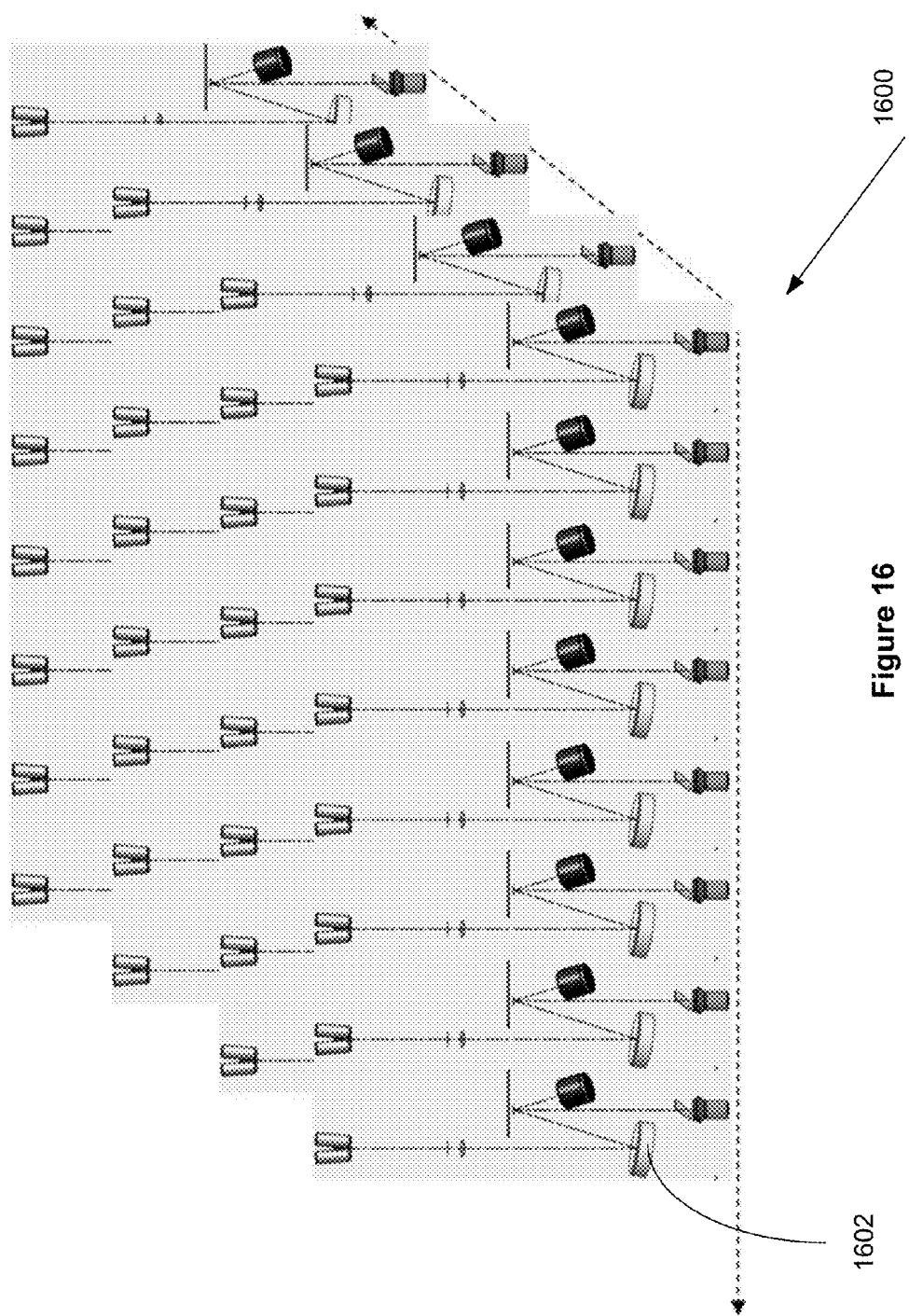
FIG. 16 illustrates an exemplary implementation of a maskless imaging writer system for making flexible display according to embodiments of the present invention.

FIG. 16 illustrates an exemplary implementation of a maskless imaging writer system for making flexible display according to embodiments of the present invention. As shown in FIG. 16 the maskless image writer system 1600 is formed by one or more arrays of SLM imaging units, where 1602 is an example of one of the SLM imaging units. The one or more arrays of SLM imaging units may be formed into a particular shape, for example circular, which may be required by a specific application. In another exemplary implementation, the maskless imaging writer system may be configured to make non-flexible displays.

Figure 17:
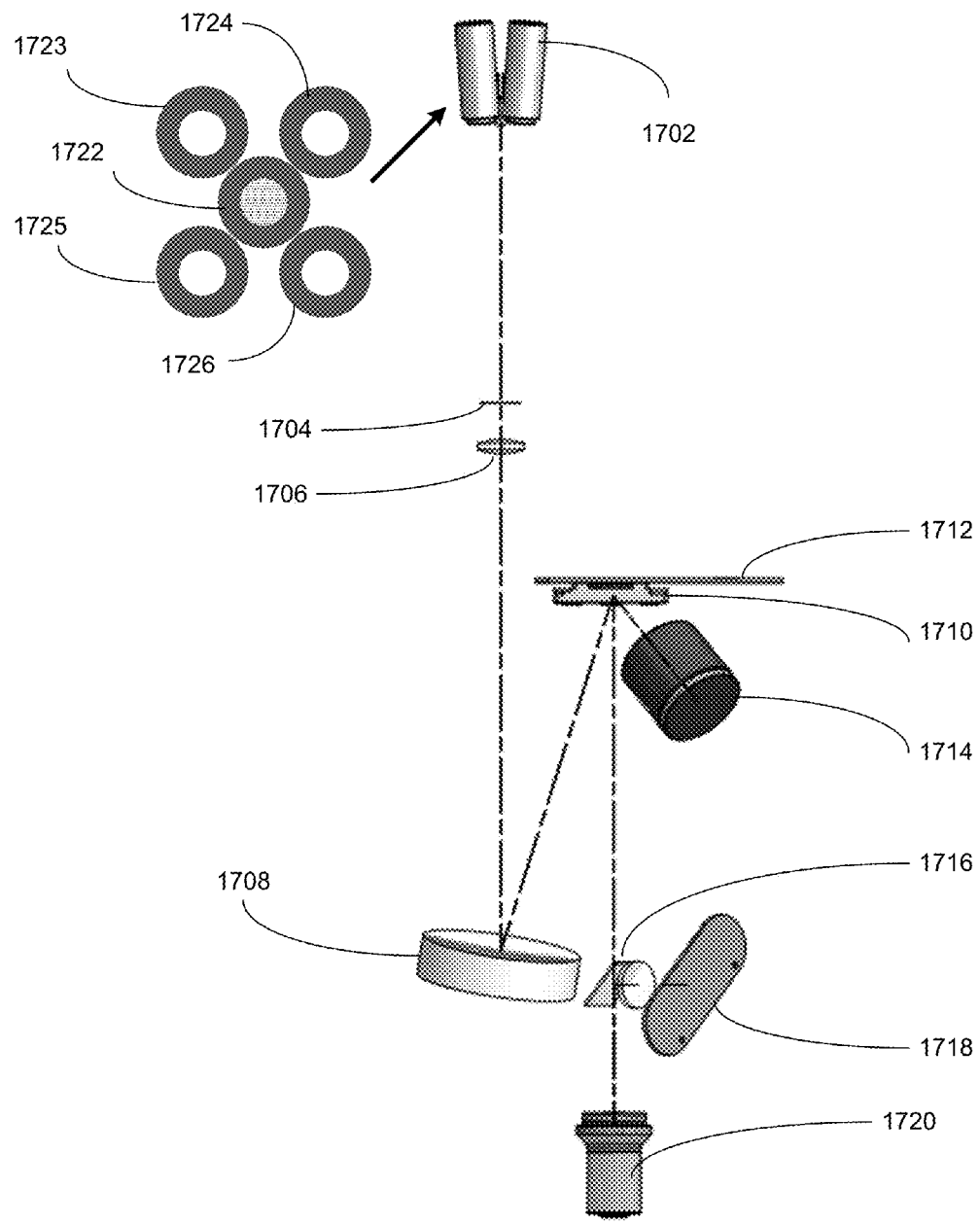
FIG. 17 illustrates a SLM imaging unit according to embodiments of the present invention.

FIG. 17 illustrates a SLM imaging unit according to embodiments of the present invention. The SLM imaging unit includes blue and red diode lasers 1702, an aperture 1704, a lens 1706, a spherical mirror 1708, a DMD 1710 mounted on a printed circuit board 1712, a beam dump 1714, a beam splitter 1716, a CCD camera 1718, and a lens assembly 1720. The blue and red diode lasers 1702 further includes a red laser diode (non-actinic) 1722 and four blue laser diodes (actinic) 1723, 1724, 1725 and 1726. The laser diodes may be arranged in the example as shown in FIG. 17. The center red laser diode is non-actinic and it is mainly used for alignment or catching for initial focus setting. The four blue laser diodes are actinic and they are used for making exposure. Depending on the physical size of the laser diode package, other types of arrangement using different numbers of laser diodes are possible as long as a uniform intensity can be achieved. In another approach, the actinic illumination can also be delivered via optical fiber bundles. In that, each laser diode shines on the one end of the optical fiber bundle and let fiber carry the actinic light to shine from the other end of the optical fiber bundle. In other embodiments, LEDs may be used instead of diode lasers. In this arrange example, the blue LEDs can be placed tightly together in such a way to achieve uniform intensity while multiple red LEDs can be placed in relative locations that may be configured to achieve alignment and initial focusing purposes. In this example, the blue and red diode lasers 1702 project light to the spherical mirror 1708 through the aperture 1704 and the lens 1706. The light is then reflected from the spherical mirror 1708 to the DMD 1710. According to the state of each mirror in the DMD, the light may be sent to the beam dump 1714, or to a substrate through the lens assembly 1720. The image thus created on the substrate reflects back upward through lens 1720 and beam splitter 1716 to CCD camera 1718.

Figure 18:
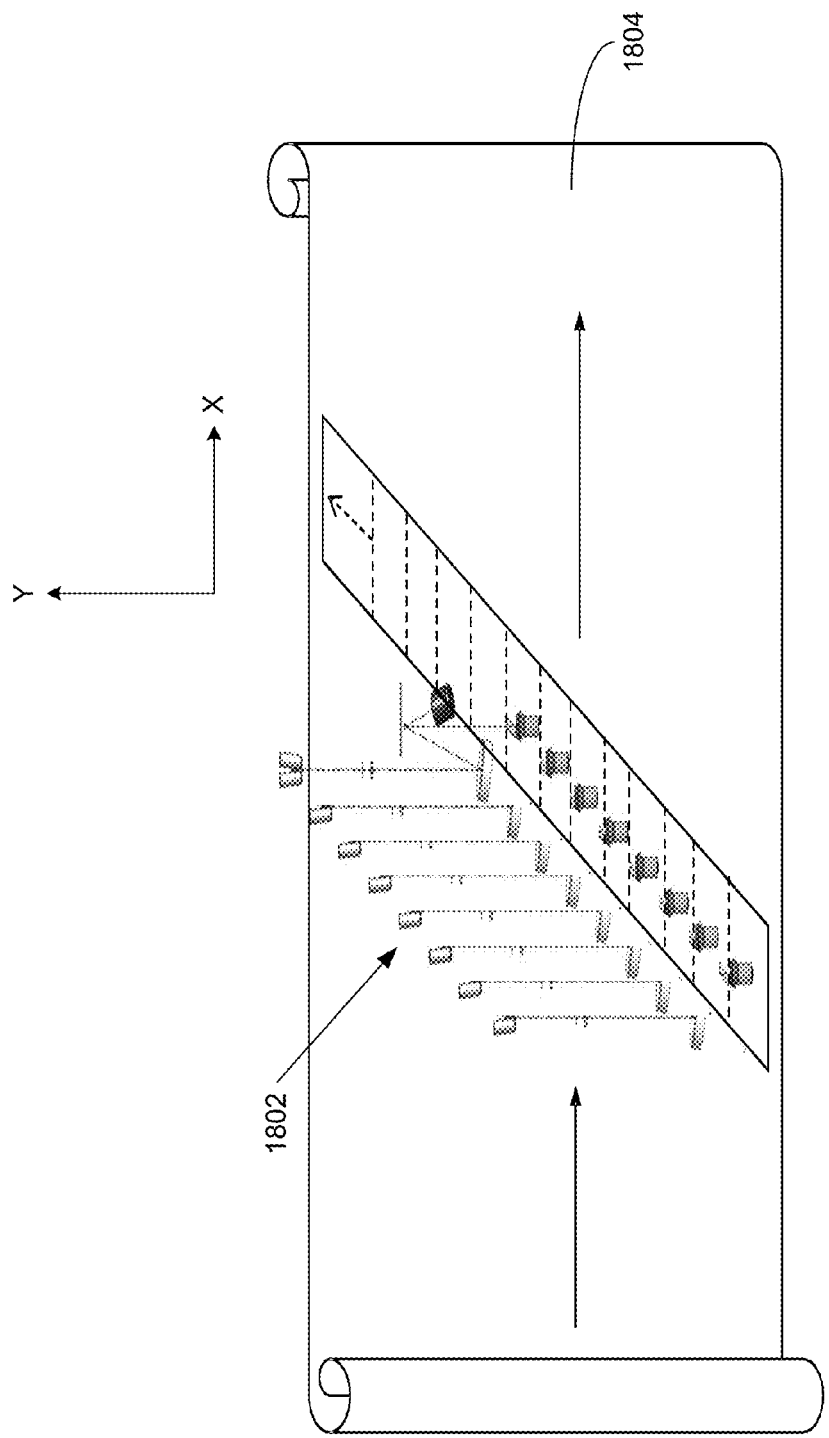
FIG. 18 illustrates a method of using a linear array of SLM imaging units for roll-to-roll maskless lithography according to embodiments of the present invention.

FIG. 18 illustrates a method of using a linear array of SLM imaging units for roll-to-roll maskless lithography according to embodiments of the present invention. In this example, the SLM imaging units 1802 are arranged as a single line array as shown in FIG. 18. The substrate 1804 may be controlled to move along the direction of substrate movement (the X direction) and the linear array of SLM imaging units 1802 may be controlled to move back and forth perpendicular to the direction of substrate movement (the Y direction) in the plane of the substrate 1804. The exposure of the linear array of SLM imaging units can be tuned to process certain area of the substrate 1804 in synchronization with the roll-to-roll substrate movement. In this way, the linear array of SLM imaging units may be controlled to image a substrate that has physical dimensions larger than the size of the linear array of SLM imaging units. Because of the ability to control the SLM imaging units to move in the direction of substrate movement as well as in the direction perpendicular to the substrate movement, the image writer system shown in FIG. 18 overcomes the size limitations of the physical masks required in the conventional methods described in the '779 patent and the Ahn article.

Figure 19:
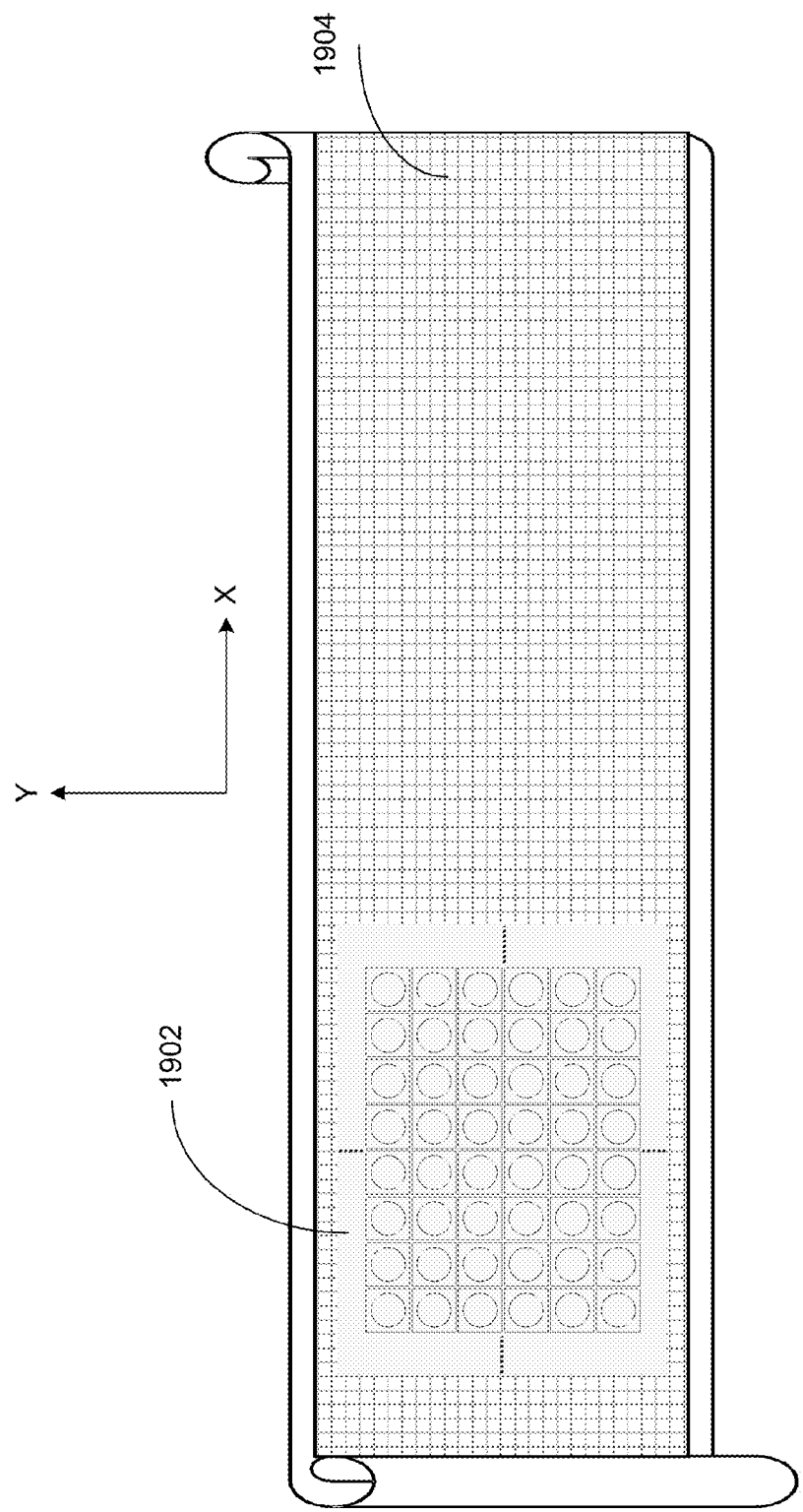
FIG. 19 illustrates a method of using a two dimensional array of SLM imaging units for roll-to-roll maskless lithography according to embodiments of the present invention.

FIG. 19 illustrates a method of using a two dimensional array of SLM imaging units for roll-to-roll maskless lithography according to embodiments of the present invention. This figure shows a top view of a two dimensional SLM imaging array 1902, where each circle represents a SLM imaging unit. Similar to the example shown in FIG. 18, the substrate 1904 may be controlled to move in the X direction and the two dimensional array of SLM imaging units 1902 may be controlled to move back and forth in the Y direction in the plane of the substrate 1904. The exposure of the two dimensional array of SLM imaging units can be tuned to process certain area of the substrate 1904 in synchronization with the roll-to-roll substrate movement. In this way, the two dimensional array of SLM imaging units may be controlled to image a substrate that has physical dimensions larger than the size of the two dimensional array of SLM imaging units. Thus, the image writer system shown in FIG. 19 overcomes the size limitations of the physical masks required in the conventional methods described in the '779 patent and the Ahn article. Note that in some embodiments, the two dimensional array of SLM imaging units may be formed in a staggered or non-staggered array formation.

Figure 20:
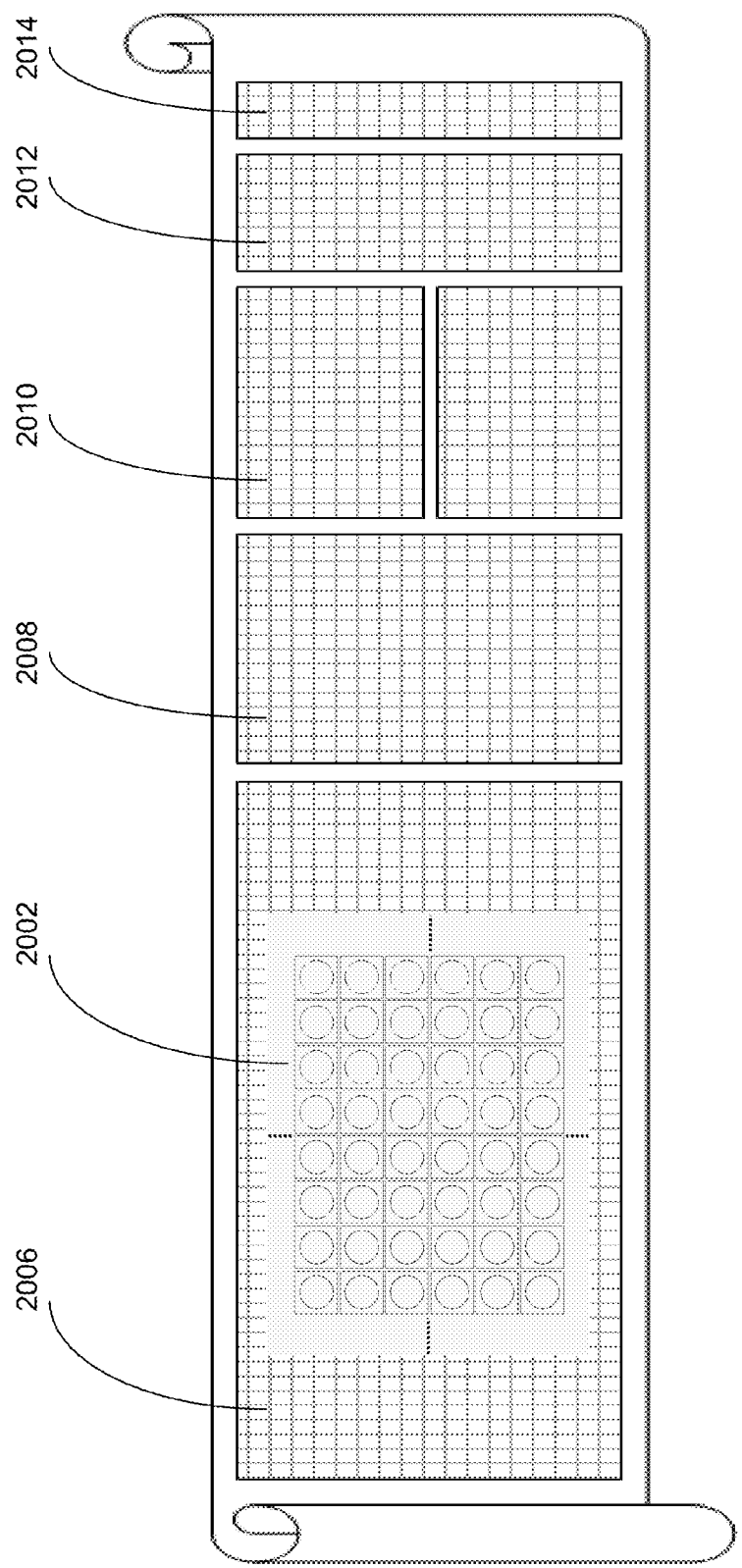
FIG. 20 illustrates a method of imaging plurality of substrate sizes using maskless lithography according to embodiments of the present invention.

FIG. 20 illustrates a method of imaging plurality of substrate sizes using maskless lithography according to embodiments of the present invention. Similar to the method described in FIG. 19, the image writer system also employs a two dimension array of SLM imaging units 2002. Since the two dimensional array of SLM imaging units 2002 may be controlled to receive and process imaging data automatically in a continuous fashion, the image writer system can transition from one substrate design to a different substrate design by loading a new TFT mask database seamlessly without the need to stop and change to a new mask as required by the conventional methods described in the '779 patent and the Ahn article. In the example shown in FIG. 20, different sized substrate designs, such as 2006, 2008, 2010, 2012, and 2014 can be processed on-the-fly as the roll-to-roll substrate containing the different sized substrate designs move by the two dimensional array of SLM imaging units 2002.

Figure 21:
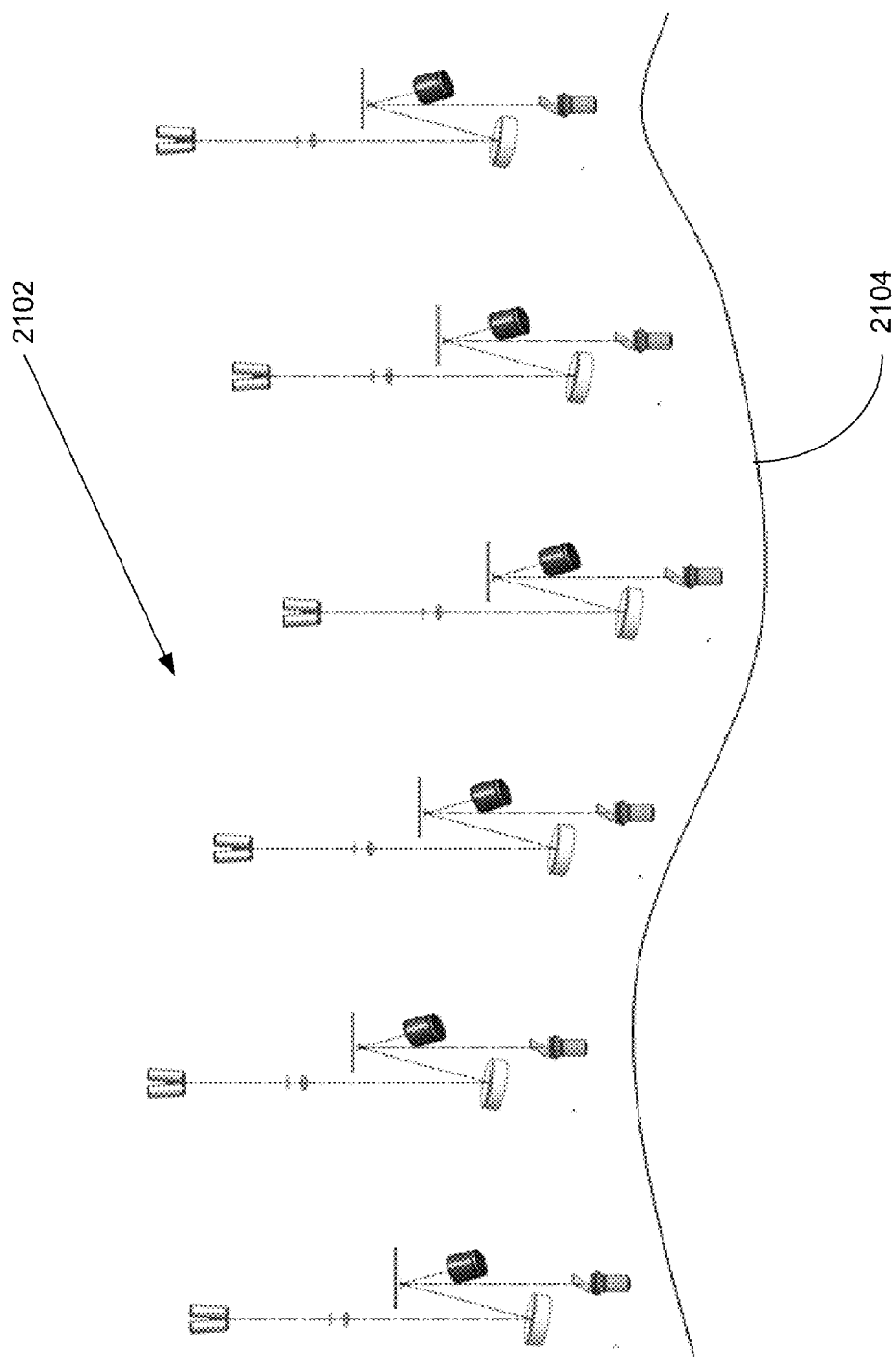
FIG. 21 illustrates a method for positioning each SLM imaging unit corresponding to conditions of localized substrate surface according to embodiments of the present invention.

FIG. 21 illustrates a method for positioning each SLM imaging unit corresponding to conditions of localized substrate surface according to embodiments of the present invention. In this example, the method examines the unevenness of the substrate surface 2104 during exposure, and adjusts the linear array of SLM imaging units 2102 accordingly. In this example, the uneven substrate 2104 is excessively shown to illustrate the benefit of having optimum height adjustment for each SLM imaging unit. This allows achieving auto-focus tuning to come within the range of DOF for intended resolution CD from 1 to 5 μm. This method is further described in the following sections.

In one approach, for printing TFT based photo voltaic (PV) panel, the minimum features CD can be more than 50 μm. In this printing resolution range, it often thought that ink-jet printing could be a less costly option. However, one major drawback for ink-jet printing is defect-prone due to ink mist, a side effect that comes with ink jet droplet stream. Ink-jet printing is inherently not as clean as lithography process. It may be suited for patterning mask features that do not form active device or mainly for passive viewing purpose. For production worthy of making active TFT device with roll-to-roll printing, scalable array of SLM imaging units provides a better solution for maskless lithography because it produces better device yield. In this method, a magnification projection is used for maskless imaging. That is, instead of using a reduction objective lens, the exposure lens of the SLM imaging unit employs an enlargement objective lens that can magnify product feature size from 25 μm to a couple of hundred μm in a controlled fashion.

Figure 22:
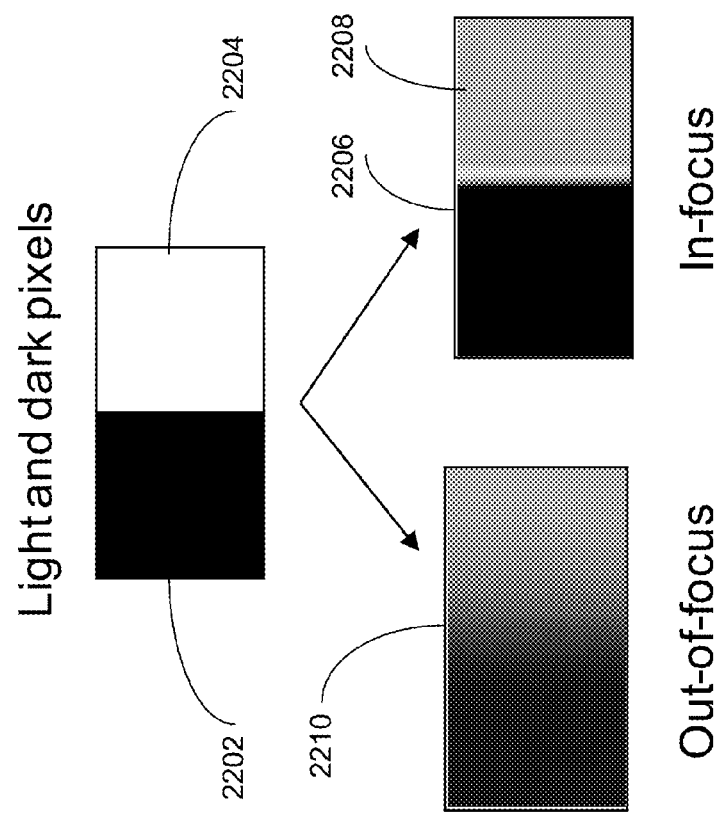
FIG. 22 illustrates a method for detecting focus of pixels according to embodiment of the present invention.

In order to maintain best focus over a substrate that may not be perfectly flat, one way is to monitor and adjust the focus of the SLM imaging unit during exposure. FIG. 22 illustrates a method for detecting focus of pixels according to embodiments of the present invention. One approach for monitoring focus is to use a through-the-lens monitoring camera to capturing images of the exposure in progress. After images are captured, an analysis of dark-light pixel image captured, in comparison with what would be expected for the exposure pattern, can readily derive a relative measure of the amount of defocus. As shown in the example of FIG. 22 is a pair of light and dark pixels (2202 and 2204) with in-focus (2206 and 2208) and an out-of-focus 2210 conditions. At the boundary transition from dark to light area, the in-focus pair exhibits a sharper transition pattern, whereas the out-of-focus pair has a blurred transition. The degree of blurred transition can be mapped to refer to the amount of defocus. In other approaches, one may monitor and analyze spatial frequencies in the image. Since focus errors preferentially reduce the higher spatial frequencies, one may assess the amount of defocus by comparing the loss of high frequency components of the image captured. Yet another method is to monitor and analyze the image contrast from a group of light-dark patterns, with image contrast being the best at optimum focus setting. And the degrees of contrast lost can be referred to the amount of de-focus.

Figure 23A:
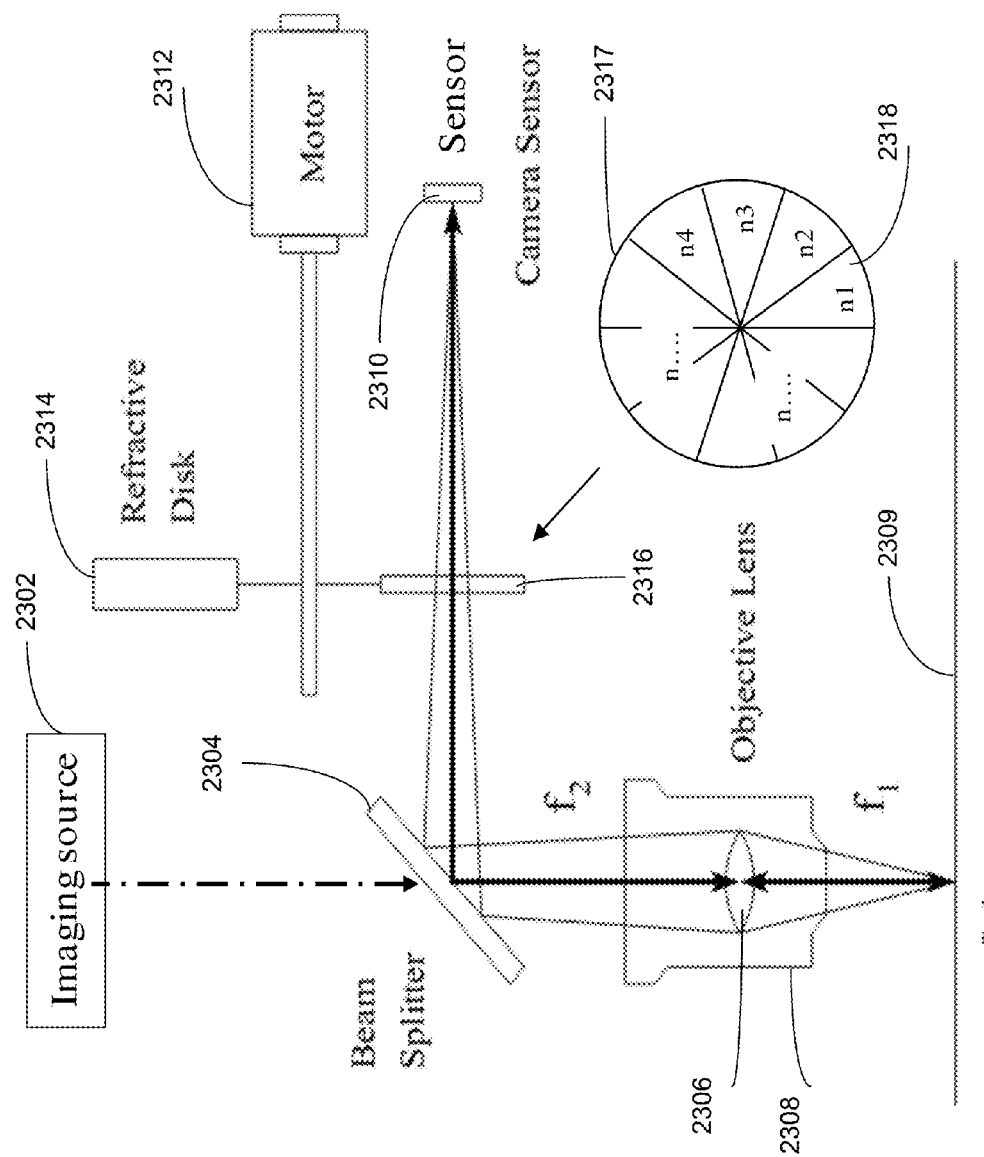
FIGS. 23a-23c illustrate exemplary apparatuses for detecting focus of a SLM imaging unit on-the-fly according to embodiments of the present invention.

Although the methods described above are effective focus monitors of the size of focus error, they do not directly provide any indication of the direction of the error. To address this issue, the system may, under software control, constantly vary the focus slightly over a range centered on the target focus, and update the target focus position to keep it at the best focus. This can most sensitively be determined by balancing the errors at the two extremes of the range. It may be advantageous, however, to avoid the need to intentionally defocus the exposure image. One way to achieve this is to perturb the focus of the camera in a controlled fashion, without altering the focus of the exposure image. This can be done on a through-the-lens monitor camera by altering the effective optical path length between the camera and the objective lens. To a first order approximation, changing the focal length on the camera side of the lens ($f_2$ in the diagram) has the same effect as changing $f_1$ by the same percentage. This focus change can be effected by vibrating the camera in and out, reflecting the image off a mirror that vibrates, or as shown in FIG. 23a, by passing the light through a spinning disk with segments having different thicknesses and/or refractive indices, to give the desired variation in effective optical path length. This is as shown as the first OPD 2316 and the second OPD 2326. Similarly, the image could be reflected off a mirrored disk, with segments at different heights.

FIG. 23a illustrates an exemplary apparatus for detecting focus of a SLM imaging unit on-the-fly according to embodiments of the present invention. As shown in FIG. 23a, the apparatus includes an imaging source 2302, a beam splitter 2304, an objective lens 2306 and its housing 2308. An example of the imaging source 2302 is shown in FIG. 17, including the components 1702 to 1714. The apparatus also includes a first camera sensor 2310 (also referred to as the camera or sensor for short), a first motor 2312, a first refractive disk 2314, and a first optical path difference (OPD) modifier 2316. The first OPD modifier 2316 may be formed from a circular optical device 2317, where the circular optical device 2317 may be made with multiple sectors (for example 2318) and each sector is made with different refraction index material, or made with the same refractive index material but with different thickness than can cause optical path difference.

Figure 23B:
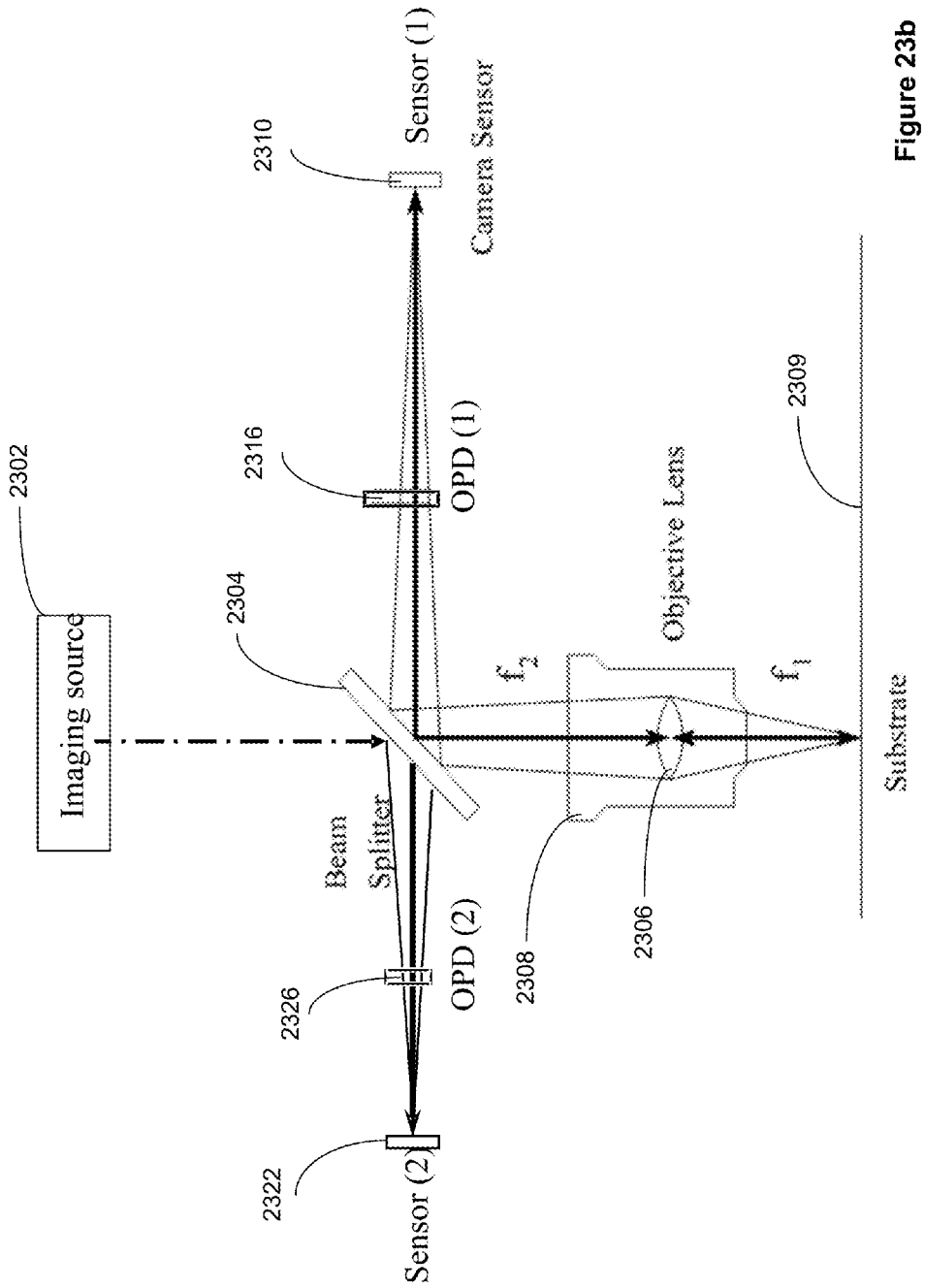
Figure 23C:
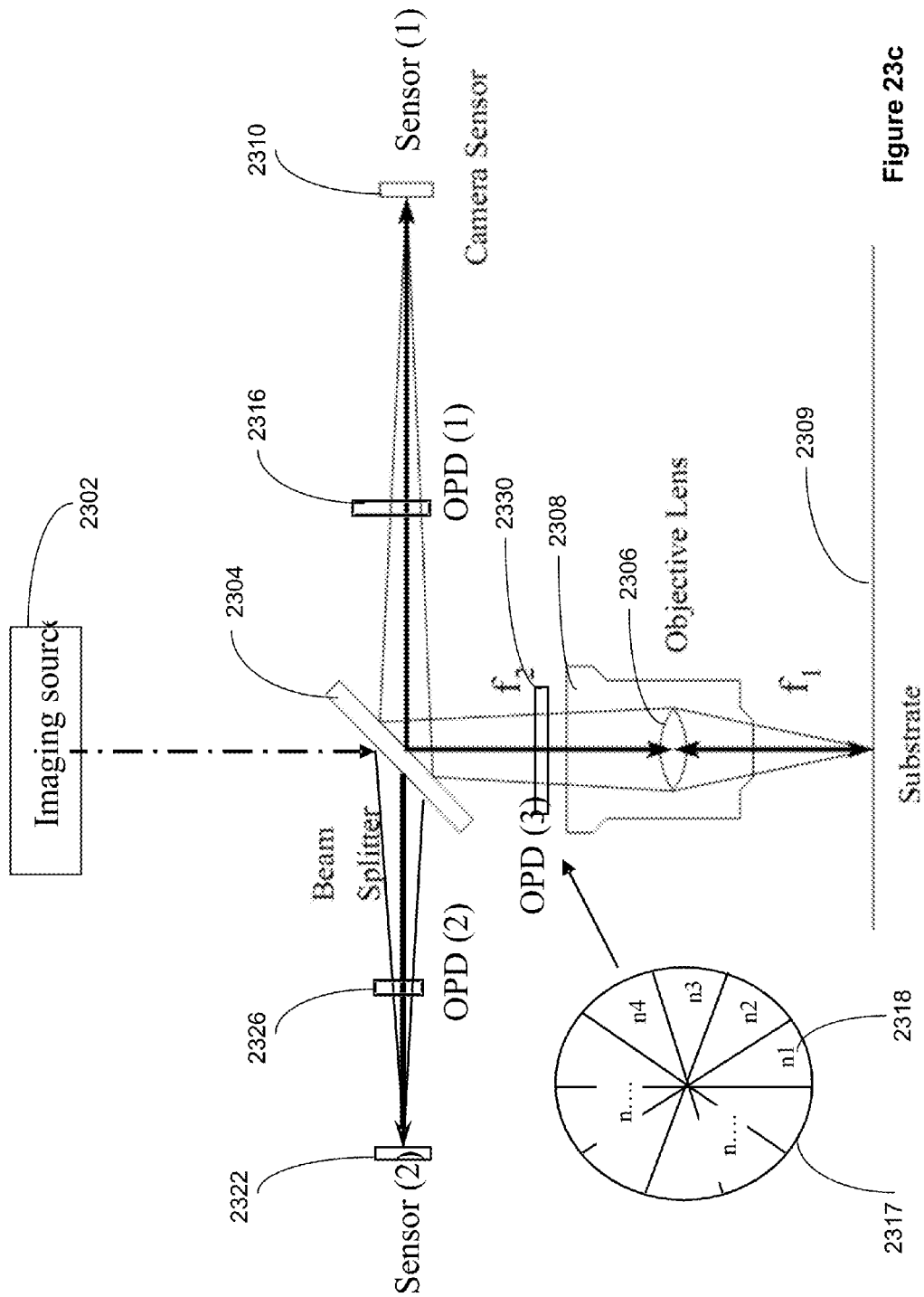

Another way of determining the focus adjustment direction is to have two cameras that can capture the images from different optical path lengths as shown in FIGS. 23b and 23c. FIGS. 23b-23c illustrates two other exemplary apparatuses for detecting focus of a SLM imaging unit on-the-fly according to embodiments of the present invention. In addition to the elements shown in FIG. 23a, these exemplary apparatus further includes a second camera sensor 2322 (also referred to as the camera or sensor for short), and a second optical path difference (OPD) modifier 2326. FIG. 23c also includes a third OPD modifier 2330. The second and third OPD modifiers 2326 and 2330 may be formed in a similar fashion as the first OPD modifier 2316. When with two camera sensors 2310 and 2322 are used, the two respective OPDs 2316 and 2326 with different refractive indexes can be set up to determine focus adjustment direction. In another embodiment, the different OPDs 2316 and 2326 are effected simply by placing the respective cameras 2310 and 2322 at different physical distances, The examples shown in FIGS. 23b-23c examine the images from first camera sensor to second camera sensor to compare and analyze the focus adjustment direction, and adjust focus setting to equalize the defocus observed in the two camera sensors, thus assuring that the best focus is achieved at an OPD midway between the two camera sensors. Here, the first and second camera sensors are configured to observe the substrate with complementary focus offsets to determine direction of a target focus. Yet another method is to avoid adjusting focus by moving the objective lens up and down, this is to place the third OPD 2330 above the housing 2308 of the objective lens 2306 to effect the focus adjustment by changing the effective optical path length.

The on-the-fly focus monitor and adjustment may be performed as follows:
1) The separation of substrate surface from the objective lens is set within the focusing range.
2) To begin with, image is formed and captured by using non-actinic illumination. This will not cause any damage to the photo sensitive material for exposure. That is, the initial focus is set by using non-actinic illumination; the objective is then adjusted accordingly for best focus.
3) As the exposure stage starts to move along the direction of substrate movement (the X direction), the actinic exposure starts.
4) Image captured is then monitored under the actinic illumination. The Objective lens is adjusted accordingly.
5) Note that each focus adjustment is for the next exposure site but based on best focus determined for the previous exposure location.
6) The amount of focus adjustment for the objective lens is based on the optical path difference measured for f1 vs. f2.

Figure 24:
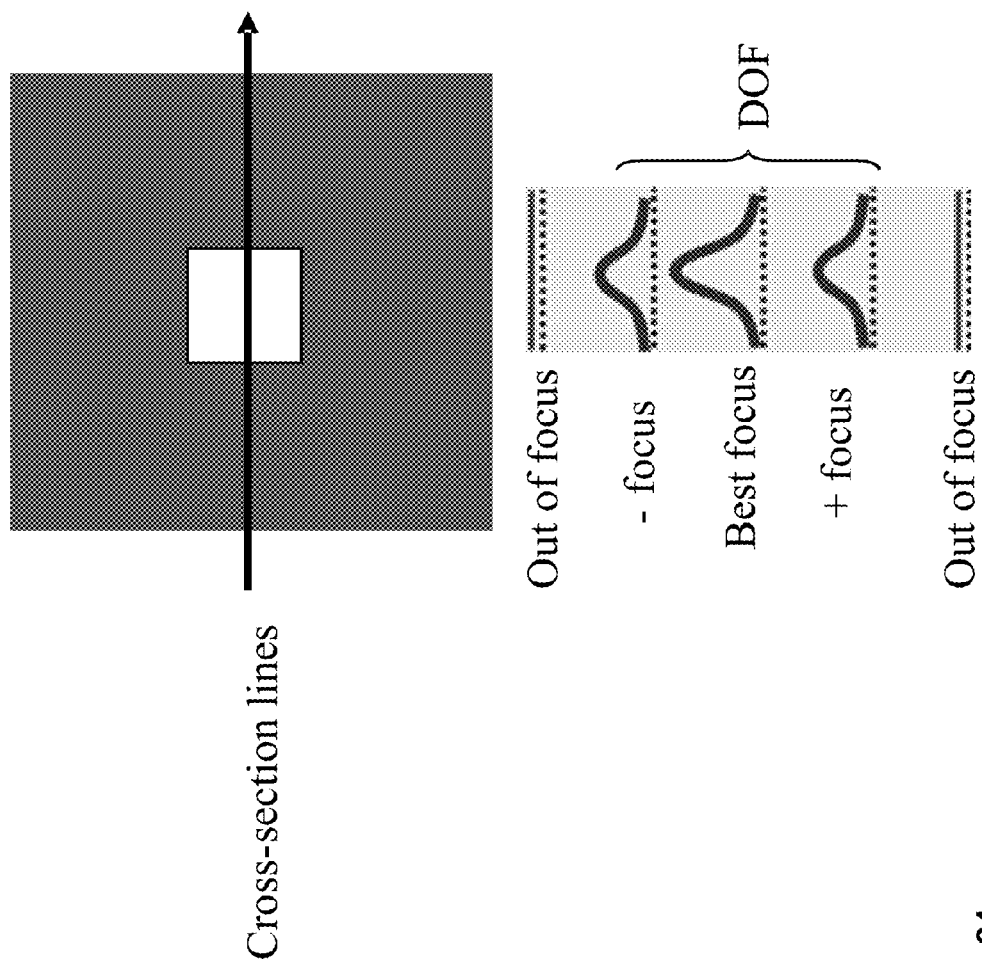
FIG. 24 illustrates an exemplary imaging pattern where pixel voting exposure may be applied according to embodiments of the present invention.

As described above, the image writing may be monitored by one or more cameras on-the-fly while exposure is taking place. By using a mirror pixel voting scheme for exposure, each image pattern is being exposed and formed by many DMD mirror pixels. This exposure scheme inherently permits more margin of focusing error at the initial stage of exposure since each mirror pixel exposure only contributes a small fraction of the total exposure energy required. As pixel voting exposure progresses, the focus of each SLM imaging unit may be tuned and adjusted on-the-fly. This margin of focus error is important for writing the features that are either isolated "hole-like" patterns surrounded by dark field, or isolated "island-like" patterns surrounded by a clear field such as the example shown in FIG. 24. This is because both aforementioned feature patterns are not easy to set optimum focus initially due to the lack of image variation while perturbing the focus setting. However, the optimum focus can be determined after a number of exposures have been progressed.

Figure 25:
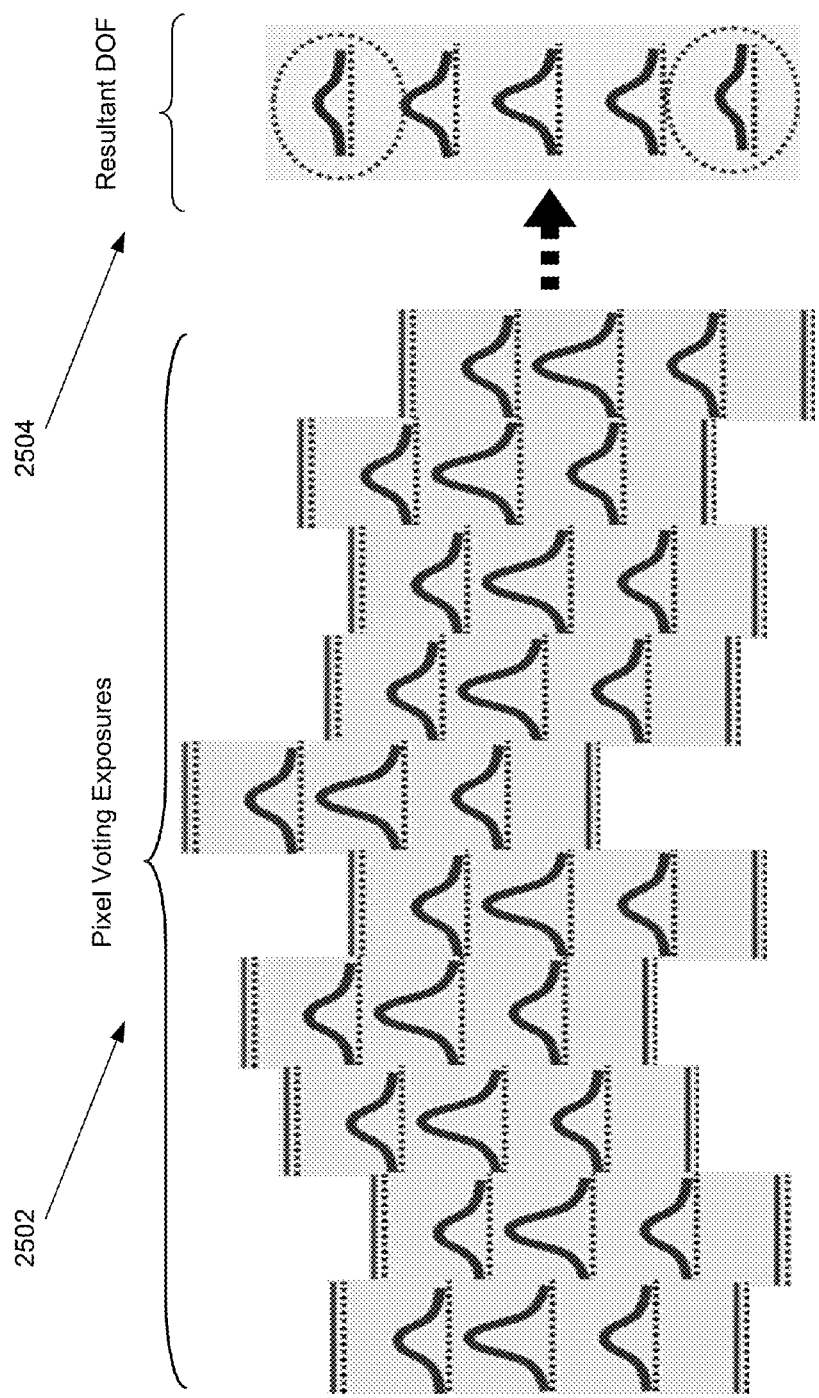
FIG. 25 illustrates a method for improving DOF through pixel voting exposures according to embodiments of the present invention.

In another approach, the type of auto-focusing mechanism described above may be used to accomplish "focus voting exposure" to expand the overall DOF. FIG. 25 illustrates a method for improving DOF through pixel voting exposures according to embodiments of the present invention. In the example shown in FIG. 25, the optimum exposure setting can be dynamically tuned during the pixel voting exposure. This allows the pixel voting exposures to be accomplished by a different best focus levels that are still within the DOF. This scheme enables the final image pattern to be exposed and formed by many votes of the focus settings 2502 that may extend to the overall resultant DOF 2504.

Embodiments of the present invention not only are applicable and beneficial to the lithography for manufacturing of FPD and mask for FPD manufacturing, the making of one-of-the-kind or precision duplicates of life-sized art on glass substrate, they are also applicable and beneficial to the manufacturing of integrated circuits, computer generated holograms (CGH), printed circuit board (PCB), for large imaging display applications in both micro and meso scales.

Embodiments of the present invention are further applicable and beneficial to lithography manufacturing processes without using mask, such as writing intended mask data patterns to substrates directly. In this way, the mask cost and associated issues of concern are eliminated. Embodiments of the present invention enable exposure tools for mask-less exposure that exceeds the throughput requirements for the upcoming G10 and beyond. More importantly, this configuration comes with improved process window to ensure better lithography yield.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The invention can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

What is claimed is:

1. A parallel imaging writer system, comprising:
   a plurality of spatial light modulator (SLM) imaging units,
   wherein each of the plurality of SLM imaging units includes one or more illumination sources, one or more alignment sources, one or more projection lenses, a plurality of micro mirrors configured to project light from the one or more illumination sources to the corresponding one or more projection lens, a first camera sensor configured to observe defocus of a substrate on-the-fly, a first motor, a first refractive disk, and a first optical path difference (OPD) modifier, wherein the first camera sensor, the first motor, the first refractive disk, and the first OPD modifier are configured to adjust focus of the first camera sensor to the substrate on-the-fly; and
   a controller configured to control the plurality of SLM imaging units, and the controller synchronizes movements of the plurality of SLM imaging units with movement of the substrate in writing a mask data to the substrate in a lithography manufacturing process.

2. The parallel imaging writer system of claim 1, wherein each SLM imaging unit further comprises:
   a second camera sensor, wherein the first and second camera sensors are configured to observe the substrate with complementary focus offsets to determine direction of a target focus.

3. The parallel imaging writer system of claim 2, wherein each SLM imaging unit further comprises:
   a third OPD modifier, wherein the third OPD modifier is configured to adjust focus of the SLM imaging unit to the substrate on-the-fly without changing distance between the one or more projection lenses and the substrate.

* * * * *